US012228454B2

(12) United States Patent
Yin et al.

(10) Patent No.: US 12,228,454 B2
(45) Date of Patent: Feb. 18, 2025

(54) LIGHT DETECTION MODULE, LIGHT DETECTION METHOD AND DISPLAY DEVICE

(71) Applicant: BOE TECHNOLOGY GROUP CO., LTD., Beijing (CN)

(72) Inventors: Xinshe Yin, Beijing (CN); Hui Zhao, Beijing (CN); Xinbin Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/005,665

(22) PCT Filed: Nov. 25, 2021

(86) PCT No.: PCT/CN2021/133292
§ 371 (c)(1),
(2) Date: Jan. 16, 2023

(87) PCT Pub. No.: WO2023/092424
PCT Pub. Date: Jun. 1, 2023

(65) Prior Publication Data
US 2024/0263999 A1    Aug. 8, 2024

(51) Int. Cl.
*G01J 3/46*    (2006.01)
*H03F 3/45*    (2006.01)

(52) U.S. Cl.
CPC ............ *G01J 3/46* (2013.01); *H03F 3/45475* (2013.01)

(58) Field of Classification Search
CPC ................................ G01J 3/46; H03F 3/45475
See application file for complete search history.

(56) References Cited

U.S. PATENT DOCUMENTS 4,810,603 A * 3/1989 Okino ................ G03B 27/32
430/30
2008/0197270 A1   8/2008 Zheng et al.
(Continued)

FOREIGN PATENT DOCUMENTS

CN    101135795 A    3/2008
CN    102857207 A    1/2013
(Continued)

OTHER PUBLICATIONS

ISA China National Intellectual Property Administration, International Search Report and Written Opinion Issued in Application No. PCT/CN2021/133292, Aug. 10, 2022, WIPO, 14 pages.

*Primary Examiner* — Thanh Luu
(74) *Attorney, Agent, or Firm* — McCoy Russell LLP

(57) ABSTRACT

A light detection module, a light detection method and a display device are provided. The light detection module includes N light sensing circuits, a control circuit, a conversion circuits and a detection circuits; N being a positive integer; the N light sensing circuits respectively sense light signals of different colors to generate corresponding photocurrents; the control circuit is configured to control to provide the photocurrents generated by the light sensing circuits to the conversion circuit in a time division manner, and to control a transfer coefficient of the conversion circuit; the conversion circuit is configured to convert the photocurrent according to the transfer coefficient to obtain an analog output voltage; the detection circuit is configured to obtain characteristics of the light signal according to the analog output voltage.

19 Claims, 6 Drawing Sheets

(56) References Cited

U.S. PATENT DOCUMENTS

| | | | |
|---|---|---|---|
| 2015/0187276 A1 | 7/2015 | Shim et al. | |
| 2017/0294173 A1* | 10/2017 | Sun | G06F 3/0304 |
| 2017/0309670 A1 | 10/2017 | Shao et al. | |
| 2018/0122321 A1 | 5/2018 | Qian | |
| 2018/0190232 A1 | 7/2018 | Xue et al. | |
| 2019/0221181 A1 | 7/2019 | Li et al. | |
| 2022/0223629 A1 | 7/2022 | Song et al. | |

FOREIGN PATENT DOCUMENTS

| | | |
|---|---|---|
| CN | 104751781 A | 7/2015 |
| CN | 105910632 A | 8/2016 |
| CN | 106448596 A | 2/2017 |
| CN | 106486082 A | 3/2017 |
| CN | 106887217 A | 6/2017 |
| CN | 112864174 A | 5/2021 |
| CN | 113588079 A | 11/2021 |
| CN | 214756999 U | 11/2021 |

* cited by examiner

LIGHT DETECTION MODULE, LIGHT DETECTION METHOD AND DISPLAY DEVICE

CROSS REFERENCE TO RELATED APPLICATION

This application is the U.S. national phase of PCT Application No. PCT/CN2021/133292 filed on Nov. 25, 2021, which is incorporated herein by reference in its entirety.

TECHNICAL FIELD

The present disclosure relates to the field of light detection technology, in particular to a light detection module, a light detection method and a display device.

BACKGROUND

With the widespread application of artificial intelligence (AI) technology in mobile display products, the application for the user in a specific environment is customized according to the environment, to increase the user's experience in different environments, so it is necessary to monitor the characteristics of the ambient light signal at the time of use. The related light detection modules cannot accurately sense the characteristics of ambient light with different colors.

SUMMARY

In one aspect, the present disclosure provides in some embodiments a light detection module, including: N light sensing circuits, a control circuit, a conversion circuits and a detection circuits; N being a positive integer; wherein the N light sensing circuits respectively sense light signals of different colors to generate corresponding photocurrents; the control circuit is configured to control to provide the photocurrents generated by the light sensing circuits to the conversion circuit in a time division manner, and to control a transfer coefficient of the conversion circuit; the conversion circuit is configured to convert the photocurrent according to the transfer coefficient to obtain an analog output voltage; the detection circuit is configured to obtain characteristics of the light signal according to the analog output voltage.

Optionally, the control circuit comprises a light sensing control sub-circuit and a sampling control sub-circuit; the conversion circuit comprises a sampling sub-circuit and M conversion sub-circuits; the sampling sub-circuit includes M sampling resistors; M is a positive integer; an input end of an mth conversion sub-circuit is electrically connected to an mth sampling resistor; m is a positive integer less than or equal to M; the light sensing control sub-circuit is configured to control to provide the photocurrents generated by the light sensing circuits to the sampling control sub-circuit in a time division manner through a current supply end under the control of a light sensing control signal; the sampling control sub-circuit is configured to control the current supply end to provide the photocurrents to the input ends of the conversion sub-circuits in a time division manner under the control of a sampling control signal; the conversion sub-circuit is configured to convert a photocurrent when the input end of the conversion sub-circuit receives the photocurrent, to obtain the analog output voltage.

Optionally, the control circuit further comprises a switch sub-circuit; the switch sub-circuit is configured to control the conversion sub-circuits to output the analog output voltage to the detection circuit in a time division manner under the control of a switch control signal.

Optionally, the light sensing control sub-circuit includes N light sensing control transistors, the sampling control sub-circuit includes M sampling control transistors; an nth light sensing circuit outputs an nth photocurrent through an nth photocurrent output end; a control electrode of an nth light sensing control transistor is electrically connected to the nth light sensing control end, a first electrode of the nth light sensing control transistor is electrically connected to the nth photocurrent output end, and a second electrode of the nth light sensing control transistor is electrically connected to the current supply end; the nth light sensing control end is configured to provide an nth light sensing control signal; a control electrode of an mth sampling control transistor is electrically connected to an mth sampling control end, a first electrode of the mth sampling control transistor is electrically connected to the current supply end, and a second electrode of the mth sampling control transistor is electrically connected to the input end of the mth conversion sub-circuit; the mth sampling control end is configured to provide an mth sampling control signal; an output end of the mth conversion sub-circuit is electrically connected to the detection circuit, and the mth conversion sub-circuit is configured to convert the nth photocurrent when the input end of the mth conversion sub-circuit receives the nth photocurrent, to obtain a corresponding analog output voltage, and output the corresponding analog output voltage to the detection circuit through the output end of the nth conversion sub-circuit.

Optionally, the control circuit further comprises a switch sub-circuit; the switch sub-circuit comprises M switches; a control end of an mth switch is electrically connected to an mth switch control end, a first end of the mth switch is electrically connected to the output end of the mth conversion sub-circuit, and a second end of the mth switch is electrically connected to the detection circuit; the mth switch control end is configured to provide an mth switch control signal.

Optionally, the light detection module further includes M filter circuits; wherein an mth filter circuit is connected between the output end of the mth conversion sub-circuit and the first end of the mth switch, and is configured to filter out high frequency noise in the corresponding analog output voltage.

Optionally, the mth conversion sub-circuit includes an mth operational amplifier; a non-inverting input end of the mth operational amplifier is the input end of the mth conversion sub-circuit; an inverting input end of the mth operational amplifier is electrically connected to the output end of the mth operational amplifier; the output end of the mth operational amplifier is the output end of the mth conversion sub-circuit; the light detection module further includes a clamping circuit; the clamping circuit is electrically connected to the input end of the detection circuit, and the detection circuit receives the analog output voltage through the input end of the detection circuit; the clamping circuit is configured to control a potential of the input end of the detection circuit to be less than or equal to a predetermined voltage value.

Optionally, the mth conversion sub-circuit includes an mth operational amplifier and an mth compensation capacitor; an inverting input end of the mth operational amplifier is the input end of the mth conversion sub-circuit; a non-inverting input end of the mth operational amplifier is electrically connected to a reference voltage end, and the mth compensation capacitor is connected between the inverting input end of the mth operational amplifier and the output end of the mth operational amplifier; the reference voltage end is used to provide a reference voltage; the output end of the mth operational amplifier is the output end of the mth conversion sub-circuit.

Optionally, the control circuit comprises a light sensing control sub-circuit and a sampling control sub-circuit; the conversion circuit comprises a conversion sub-circuit and a sampling sub-circuit; the sampling sub-circuit includes M sampling resistors; M is a positive integer; the light sensing control sub-circuit is configured to control to provide the photocurrents generated by the light sensing circuits to the input end of the conversion sub-circuit in time division manner under the control of the light sensing control signal; the sampling control sub-circuit is configured to control first ends of the sampling resistors to be connected to the input end of the conversion sub-circuit in a time division manner under the control of the sampling control signal; control second ends of the sampling resistors to be connected to the output end of the conversion sub-circuit; the conversion sub-circuit is used to convert the photocurrent to obtain and output the analog output voltage through the output end of the conversion sub-circuit.

Optionally, the light sensing control sub-circuit includes N light sensing control transistors; the sampling control sub-circuit includes M sampling control switches; n is a positive integer less than or equal to N, and m is a positive integer less than or equal to M; a control electrode of an nth light sensing control transistor is electrically connected to the nth light sensing control end, a first electrode of the nth light sensing control transistor is electrically connected to the nth photocurrent output end, and a second electrode of the nth light sensing control transistor is electrically connected to the input end of the conversion sub-circuit; the nth light sensing control end is used to provide an nth light sensing control signal; a control end of an mth sampling control switch is electrically connected to the mth sampling control end, a first end of the mth sampling control switch is electrically connected to the input end of the conversion sub-circuit, and a second end of the mth sampling control switch is electrically connected to the first end of the mth sampling resistor, and the second end of the mth sampling resistor is electrically connected to the output end of the conversion sub-circuit.

Optionally, the light detection module further includes a filter circuit; wherein the filter circuit is connected between the output end of the conversion sub-circuit and the detection circuit, and is configured to filter out high frequency noise in the analog output voltage, and provide the analog output voltage after filtering out the high frequency noise to the detection circuit; the detection circuit is configured to obtain the characteristics of the light signal according to the analog output voltage after filtering out the high frequency noise.

Optionally, the conversion sub-circuit includes an operational amplifier and a compensation capacitor; the inverting input end of the operational amplifier is the input end of the conversion sub-circuit, and the non-inverting input end of the operational amplifier is electrically connected to the reference voltage end; the compensation capacitor is connected between the inverting input end of the operational amplifier and the output end of the operational amplifier; the reference voltage end is used to provide a reference voltage; the output end of the operational amplifier is the output end of the conversion sub-circuit.

Optionally, the conversion sub-circuit includes an operational amplifier; a non-inverting input end of the operational amplifier is the input end of the conversion sub-circuit, and an inverting input end of the operational amplifier is electrically connected to an output end of the operational amplifier, the output end of the operational amplifier is the output end of the conversion sub-circuit; the light detection module further includes a clamping circuit; the clamping circuit is electrically connected to the input end of the detection circuit, and the detection circuit receives the analog output voltage through the input end of the detection circuit; the clamping circuit is used to control a potential of the input end of the detection circuit to be less than or equal to a predetermined voltage value.

Optionally, the detection circuit comprises an analog-to-digital converter and an output processing unit; the analog-to-digital converter is configured to convert the analog output voltage into a digital output voltage; the output processing unit is electrically connected to the analog-to-digital converter, and is configured to receive the digital output voltage, and obtain the characteristics of the light signal according to the digital output voltage; a high-precision voltage conversion range of the analog-to-digital converter is greater than or equal to a first voltage VS1 and less than or equal to a second voltage VS2; a voltage conversion range of the analog-to-digital converter is greater than or equal to a third voltage VS3 and less than or equal to a fourth voltage VS4; the fourth voltage VS4 is greater than the second voltage VS2; the predetermined voltage value is greater than or equal to the second voltage VS2 and less than or equal to the fourth voltage VS4.

Optionally, the light detection module further includes a control signal generating unit; wherein the control signal generating unit is configured to provide the light sensing control signal and the sampling control signal.

Optionally, the detection circuit comprises an analog-to-digital converter and an output processing unit; the analog-to-digital converter is configured to convert the analog output voltage to the digital output voltage; the output processing unit is electrically connected to the analog-to-digital converter, and is configured to receive the digital output voltage and obtain the characteristics of the light signal according to the digital output voltage.

Optionally, the characteristics of the light signal include at least one of light intensity, brightness, color coordinates, or color temperature.

Optionally, the nth light sensing circuit comprises an nth photodiode; n is a positive integer less than or equal to N; a cathode of the nth photodiode is electrically connected to a power supply voltage end, and an anode of the nth photodiode is configured to provide an nth photocurrent; the power supply voltage end is configured to provide a power supply voltage signal.

In a second aspect, a light detection method is applied to the light detection module and includes: sensing, by N light sensing circuits, light signals of different colors respectively to generate corresponding photocurrents; controlling, by the control circuit, to provide the photocurrents generated by the light sensing circuits to the conversion circuit in a time division manner, and controlling the transfer coefficient of the conversion circuit; converting, by the conversion circuit, the photocurrents according to the transfer coefficient to obtain the analog output voltage; obtaining, by the detection circuit, the characteristics of the light signal according to the analog output voltage.

Optionally, the control circuit includes a light sensing control sub-circuit and a sampling control sub-circuit; the conversion circuit includes a sampling sub-circuit and M conversion sub-circuits; the sampling sub-circuit includes M sampling resistors; an input end of an mth conversion sub-circuit is electrically connected to an mth sampling resistor; M is a positive integer; m is a positive integer less than or equal to M; the step of controlling, by the control circuit, to provide the photocurrents generated by the light sensing circuits to the conversion circuit in a time division manner includes: controlling, by the light sensing control sub-circuit, to provide the photocurrents generated by the light sensing circuits to the sampling control sub-circuit in a time division manner through the current supply end under the control of the light sensing control signal; controlling, by the sampling control sub-circuit, the current supply end to provide the photocurrents to the input ends of the conversion sub-circuits in a time division manner under the control of the sampling control signal; the step of converting, by the conversion circuit, the photocurrent according to the transfer coefficient to obtain an analog output voltage includes: when the input end of the conversion sub-circuit receives the photocurrent, performing, by the conversion sub-circuit, the conversion to the photocurrent to obtain the analog output voltage.

Optionally, the control circuit includes a light sensing control sub-circuit and a sampling control sub-circuit; the conversion circuit includes a conversion sub-circuit and a sampling sub-circuit; the sampling sub-circuit includes M sampling resistors; M is a positive integer; the step of controlling, by the control circuit, to provide the photocurrents generated by the light sensing circuits to a conversion circuit in a time division manner includes: controlling, by the light sensing control sub-circuit, to provide the photocurrents generated by the light sensing circuits to the input end of the conversion sub-circuit in a time division manner under the control of the light sensing control signal; controlling, by the sampling control sub-circuit, to connect first ends of the sampling resistors and the input end of the conversion sub-circuit in a time division manner under the control of the sampling control signal; the step of converting, by the conversion circuit, the photocurrent according to the transfer coefficient to obtain an analog output voltage includes: performing, by the conversion sub-circuit, conversion on the photocurrent to obtain the analog output voltage and output the analog output voltage through the output end of the conversion sub-circuit.

Optionally, the detection circuit includes an analog-to-digital converter and an output processing unit; the steps of obtaining, by the detection circuit, the characteristic of the light signal according to the analog output voltage include: converting, by the analog-to-digital converter, the analog output voltage into a digital output voltage; obtaining, by the output processing unit, the characteristics of the light signal according to the digital output voltage.

Optionally, a high-precision voltage conversion range of the analog-to-digital converter is greater than or equal to a first voltage VS1 and less than or equal to a second voltage VS2, and a voltage conversion range of the analog-to-digital converter is greater than or equal to a third voltage VS3 and less than or equal to a fourth voltage VS3; the fourth voltage VS3 is greater than the second voltage VS2; the third voltage VS3 is less than the first voltage VS1; the steps of obtaining, by the output processing unit, the characteristic of the light signal according to the digital output voltage include: determining whether a voltage value of the analog output voltage corresponding to the digital output voltage is greater than or equal to the second voltage VS2 or less than or equal to the first voltage VS1; when it is determined that the voltage value of the analog output voltage corresponding to the digital output voltage is greater than or equal to the second voltage VS2 or less than or equal to the first voltage VS1, discarding the digital output voltage; when it is determined that the voltage value of the analog output voltage corresponding to the digital output voltage is greater than the first voltage VS1 and less than the second voltage VS2, obtaining the characteristics of the light signal according to the digital output voltage.

In a third aspect, a display device includes the light detection module.

DETAILED DESCRIPTION

Figure 1:
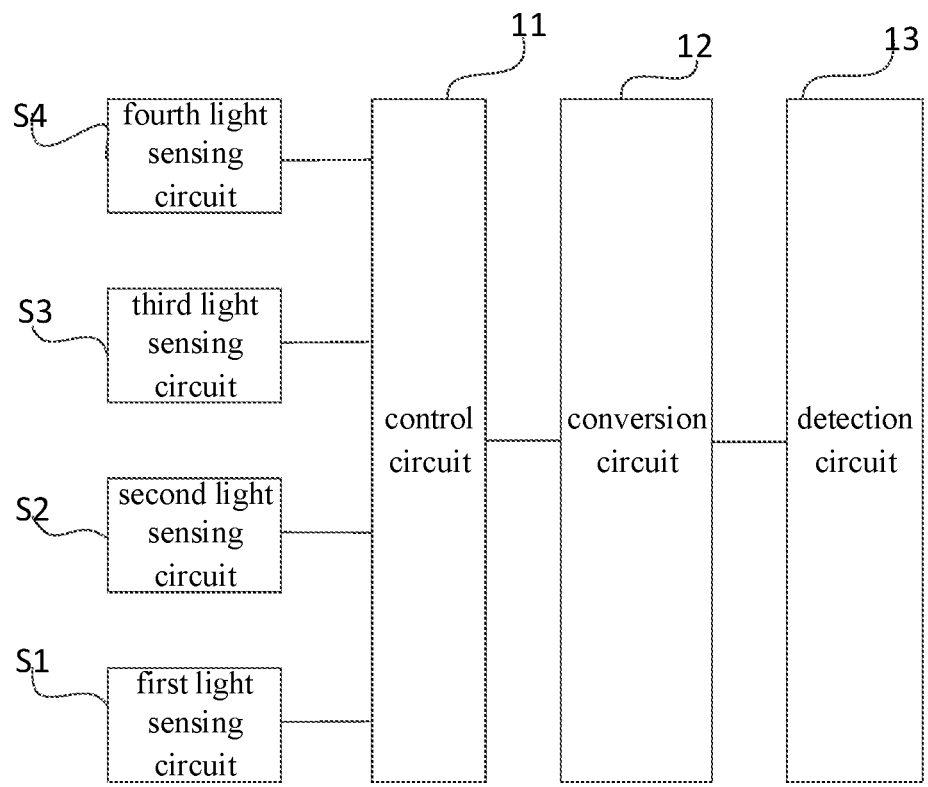
FIG. 1 is a structural diagram of a light detection module according to at least one embodiment of the present disclosure.

The technical solutions in the embodiments of the present disclosure will be clearly and completely described below with reference to the accompanying drawings in the embodiments of the present disclosure. Obviously, the described embodiments are only a part of the embodiments of the present disclosure, but not all of the embodiments. Based on the embodiments in the present disclosure, all other embodiments obtained by those of ordinary skill in the art without creative work shall fall within the protection scope of the present disclosure.

The transistors used in all the embodiments of the present disclosure may be triodes, thin film transistors, field effect transistors, or other devices with the same characteristics. In the embodiments of the present disclosure, in order to distinguish the two electrodes of the transistor except the control electrode, one electrode is called a first electrode, and the other electrode is called a second electrode.

In actual operation, when the transistor is a thin film transistor or a field effect transistor, the first electrode may be a drain electrode, and the second electrode may be a source electrode; or, the first electrode may be a source electrode, the second electrode may be a drain electrode.

The light detection module described in the embodiment of the present disclosure includes N light sensing circuits, a control circuit, a conversion circuit and a detection circuit; N is a positive integer;

The N light sensing circuits respectively sense light signals of different colors to generate corresponding photocurrents;

The control circuit is configured to control to provide the photocurrents generated by the light sensing circuits to the conversion circuit in a time division manner, and to control a transfer coefficient of the conversion circuit;

The conversion circuit is configured to convert the photocurrent according to the transfer coefficient to obtain an analog output voltage;

The detection circuit is configured to obtain characteristics of the light signal according to the analog output voltage.

The light detection module according to the embodiment of the present disclosure senses light signals of different colors through different light sensing circuits, respectively, generates corresponding photocurrents, and controls, by the control circuit, to provide the photocurrents to the conversion circuit in a time division manner. The control circuit controls the transfer coefficient of the conversion circuit, the conversion circuit converts the photocurrent according to the transfer coefficient to obtain an analog output voltage, the detection circuit obtains the characteristics of the light signal according to the analog output voltage, and can accurately sense characteristics of ambient light with different colors.

Optionally, the characteristics of the light signal may include at least one of light intensity, color coordinates, and color temperature, but are not limited thereto.

In at least one embodiment of the present disclosure, taking N equal to 4 as an example, the light detection module includes four light sensing circuits: a red light sensing circuit, a green light sensing circuit, a blue light sensing circuit, and a white light sensing circuit. However, in actual operation, the number and type of the light sensing circuits included in the light detection module can be selected according to the actual situation.

As shown in FIG. 1, the light detection module according to at least one embodiment of the present disclosure includes a first light sensing circuit S1, a second light sensing circuit S2, a third light sensing circuit S3, a fourth light sensing circuit S4, a control circuit 11, a conversion circuit 12 and a detection circuit 13;

The first light sensing circuit S1 is configured to sense a red light signal to generate a corresponding first photocurrent;

The second light sensing circuit S2 is configured to sense a green light signal to generate a corresponding second photocurrent;

The third light sensing circuit S3 is configured to sense a blue light signal to generate a corresponding third photocurrent;

The fourth light sensing circuit S4 is configured to sense a white light signal to generate a corresponding fourth photocurrent;

The control circuit 11 is electrically connected to the first light sensing circuit S1, the second light sensing circuit S2, the third light sensing circuit S3, the fourth light sensing circuit S4 and the conversion circuit 12 respectively, is configured to control to provide the first photocurrent, the second photocurrent, the third photocurrent, and the fourth photocurrent to the conversion circuit 12 in a time division manner, and configured to control the transfer coefficient of the conversion circuit 12;

The conversion circuit 12 is configured to convert the first photocurrent according to the transfer coefficient when the first photocurrent is received, to obtain a corresponding first analog output voltage, and convert the second photocurrent when the second photocurrent is received, to obtain a corresponding second analog output voltage, and convert the third photocurrent when the third photocurrent is received, to obtain a corresponding third analog output voltage, and convert the fourth photocurrent when the fourth photocurrent is received, to obtain a corresponding fourth analog output voltage.

The detection circuit 13 is electrically connected to the conversion circuit 12, is configured to obtain the characteristics of the red light signal according to the first analog output voltage, obtain the characteristics of the green light signal according to the second analog output voltage, obtain the characteristics of the blue light signal according to the third analog output voltage, and obtain the characteristics of the white light signal according to the fourth analog output voltage.

Optionally, the conversion circuit may include a voltage follower or a current-voltage converter, but is not limited thereto.

In at least one embodiment of the present disclosure, the transfer coefficient may be: a ratio of an absolute value of a variation in the voltage value of the analog output voltage outputted by the conversion circuit to an absolute value of a variation in the current value of the photocurrent received by the conversion circuit.

In at least one embodiment of the present disclosure, the control circuit may include a light sensing control sub-circuit and a sampling control sub-circuit; the conversion circuit may include a sampling sub-circuit and M conversion sub-circuits; the sampling sub-circuit may include M sampling resistors; M is a positive integer;

An input end of the mth conversion sub-circuit is electrically connected to the mth sampling resistor; m is a positive integer less than or equal to M;

The light sensing control sub-circuit is configured to control to provide the photocurrents generated by the light sensing circuits to the sampling control sub-circuit in a time division manner through a current supply end;

The sampling control sub-circuit is configured to control the current supply end to provide the photocurrent to the input end of each conversion sub-circuit in a time division manner under the control of the sampling control signal;

The conversion sub-circuit is configured to convert the photocurrent when the input end of the conversion sub-circuit is connected to the photocurrent, to obtain the analog output voltage.

In a specific implementation, the control circuit may include a light sensing control sub-circuit and a sampling control sub-circuit, the conversion circuit may include a sampling sub-circuit and M conversion sub-circuits, the sampling sub-circuit may include M sampling resistors, and the light sensing control sub-circuit may can control to provide the photocurrent generated by each light sensing circuit to the sampling control sub-circuit in a the time division manner under the control of the light sensing control signal, and the sampling control sub-circuit can control to provide each photocurrent to the input end of each conversion sub-circuit in a time division manner under the control of the sampling control signal, the input end of the mth conversion sub-circuit is electrically connected to the mth sampling resistor, and the resistance value of the mth sampling resistor determines the corresponding transfer coefficient.

In at least one embodiment of the present disclosure, when M is equal to 4, but in actual operation, the value of M can be selected according to the actual situation.

In at least one embodiment of the present disclosure, the control circuit may further include a switch sub-circuit;

The switch sub-circuit is respectively electrically connected to the conversion sub-circuits and the detection circuit, and is configured to control the conversion sub-circuits to output the analog output voltage to the detection circuit in a time division manner under the control of a switch control signal.

Figure 2:
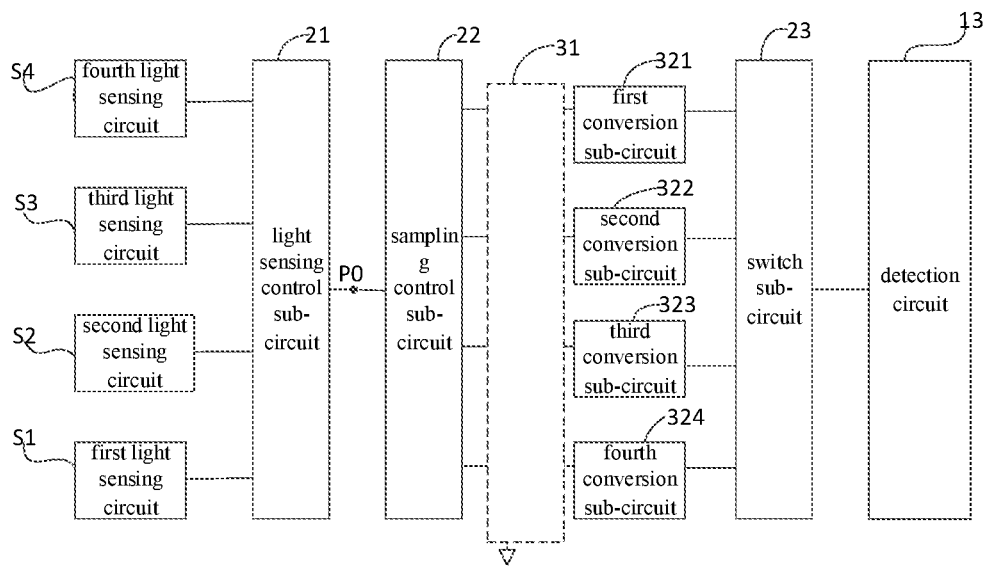
FIG. 2 is a structural diagram of a light detection module according to at least one embodiment of the present disclosure.

As shown in FIG. 2, based on at least one embodiment of the light detection module shown in FIG. 1, the control circuit may include a light sensing control sub-circuit 21, a sampling control sub-circuit 22 and a switch sub-circuit 23; The conversion circuit may include a sampling sub-circuit 31, a first conversion sub-circuit 321, a second conversion sub-circuit 322, a third conversion sub-circuit 323 and a fourth conversion sub-circuit 324; the sampling sub-circuit 31 may include a first sampling resistor RS1, a second sampling resistor RS2, a third sampling resistor RS3 and a fourth sampling resistor RS4;

An input end of the first conversion sub-circuit 321 is electrically connected to a first end of the first sampling resistor RS1;

An input end of the second conversion sub-circuit 322 is electrically connected to a first end of the second sampling resistor RS2;

An input end of the third conversion sub-circuit 323 is electrically connected to a first end of the third sampling resistor RS3;

An input end of the fourth conversion sub-circuit 324 is electrically connected to a first end of the fourth sampling resistor RS4;

A second end of the first sampling resistor RS1, a second end of the second sampling resistor RS2, a second end of the third sampling resistor RS3 and a second end of the fourth sampling resistor RS4 are grounded;

The light sensing control sub-circuit 21 is respectively electrically connected to the first light sensing circuit S1, the second light sensing circuit S2, the third light sensing circuit S3, the fourth light sensing circuit S4 and the sampling control sub-circuit 22, and is configured to control to provide a first photocurrent, a second photocurrent, a third photocurrent and a fourth photocurrent to the sampling control sub-circuit 22 in a time division manner through a current supply end P0 under the control of the light sensing control signal.

The sampling control sub-circuit 22 is electrically connected to the input end of the first conversion sub-circuit 321, the input end of the second conversion sub-circuit 322, the input end of the third conversion sub-circuit 323 and the input end of the fourth conversion sub-circuit 324 respectively, is configured to control the current supply end P0 to provide the first photocurrent, the second photocurrent, the third photocurrent, and the fourth photocurrent to input ends of these conversion sub-circuits in a time division manner under the control of sampling control signal;

The switch sub-circuit 23 is electrically connected to the first conversion sub-circuit 321, the second conversion sub-circuit 322, the third conversion sub-circuit 323, the fourth conversion sub-circuit 324 and the detection circuit 13 respectively, is configured to control these conversion sub-circuits to output corresponding analog output voltages to the detection circuit 13 in a time division manner under the control of the switch control signal;

The first conversion sub-circuit 321 is configured to convert the first photocurrent to obtain a corresponding first analog output voltage when the input end of the first conversion sub-circuit 321 receives the first photocurrent, and is also configured to convert the second photocurrent to obtain a corresponding second analog output voltage when the input end of the first conversion sub-circuit 321 receives the second photocurrent; is further configured to convert the third photocurrent to obtain a corresponding third analog output voltage when the input end of the first conversion sub-circuit 321 receives the third photocurrent; and is further configured to convert the fourth photocurrent to obtain a corresponding fourth analog output voltage when the input end of the first conversion sub-circuit 321 receives the fourth photocurrent.

The second conversion sub-circuit 322 is configured to convert the first photocurrent to obtain a corresponding first analog output voltage when the input end of the second conversion sub-circuit 322 receives the first photocurrent, and is also configured to convert the second photocurrent to obtain a corresponding second analog output voltage when the input end of the second conversion sub-circuit 322 receives the second photocurrent; is further configured to convert the third photocurrent to obtain a corresponding third analog output voltage when the input end of the second conversion sub-circuit 322 receives the third photocurrent; and is further configured to convert the fourth photocurrent to obtain a corresponding fourth analog output voltage when the input end of the second conversion sub-circuit 322 receives the fourth photocurrent.

The third conversion sub-circuit 323 is configured to convert the first photocurrent to obtain a corresponding first analog output voltage when the input end of the third conversion sub-circuit 323 receives the first photocurrent, and is also configured to convert the second photocurrent to obtain a corresponding second analog output voltage when the input end of the third conversion sub-circuit 323 receives the second photocurrent; is further configured to convert the third photocurrent to obtain a corresponding third analog output voltage when the input end of the third conversion sub-circuit 323 receives the third photocurrent; and is further configured to convert the fourth photocurrent to obtain a corresponding fourth analog output voltage when the input end of the third conversion sub-circuit 323 receives the fourth photocurrent.

The fourth conversion sub-circuit 324 is configured to convert the first photocurrent to obtain a corresponding first analog output voltage when the input end of the fourth conversion sub-circuit 324 receives the first photocurrent, and is also configured to convert the second photocurrent to obtain a corresponding second analog output voltage when the input end of the fourth conversion sub-circuit 324 receives the second photocurrent; is further configured to convert the third photocurrent to obtain a corresponding third analog output voltage when the input end of the fourth conversion sub-circuit 324 receives the third photocurrent; and is further configured to convert the fourth photocurrent to obtain a corresponding fourth analog output voltage when the input end of the fourth conversion sub-circuit 324 receives the fourth photocurrent.

In at least one embodiment of the light detection module shown in FIG. 2, the resistance value of the first sampling resistor RS1 determines the transfer coefficient of the first conversion sub-circuit 321, and the resistance value of the second sampling resistor RS2 determines the transfer coefficient of the second conversion sub-circuit 322, the resistance value of the third sampling resistor RS3 determines the transfer coefficient of the third conversion sub-circuit 323, and the resistance value of the fourth sampling resistor RS4 determines the transfer coefficient of the fourth conversion sub-circuit 324.

Optionally, the light sensing control sub-circuit includes N light sensing control transistors, the sampling control sub-circuit includes M sampling control transistors; the nth light sensing circuit outputs the nth photocurrent through the nth photocurrent output end;

The control electrode of the nth light sensing control transistor is electrically connected to the nth light sensing control end, the first electrode of the nth light sensing control transistor is electrically connected to the nth photocurrent output end, and the second electrode of the nth light sensing control transistor is electrically connected to the current supply end; the nth light sensing control end is configured to provide the nth light sensing control signal;

The control electrode of the mth sampling control transistor is electrically connected to the mth sampling control end, the first electrode of the mth sampling control transistor is electrically connected to the current supply end, and the second electrode of the mth sampling control transistor is electrically connected to the input end of the mth conversion sub-circuit; the mth sampling control end is configured to provide the mth sampling control signal;

The output end of the mth conversion sub-circuit is electrically connected to the detection circuit, and the mth conversion sub-circuit is configured to convert the nth photocurrent when the input end of the mth conversion sub-circuit receives the nth photocurrent to obtain corresponding analog output voltage, and output the corresponding analog output voltage to the detection circuit through the output end of the nth conversion sub-circuit.

In at least one embodiment of the present disclosure, the control circuit further includes a switch sub-circuit; the switch sub-circuit includes M switches;

The control end of the mth switch is electrically connected to the control end of the mth switch, the first end of the mth switch is electrically connected to the output end of the mth conversion sub-circuit, and the second end of the mth switch is electrically connected to the detection circuit; The mth switch control end is configured to provide the mth switch control signal.

The light detection module described in at least one embodiment of the present disclosure may further include M filter circuits;

The mth filter circuit is connected between the output end of the mth conversion sub-circuit and the first end of the mth switch, and is configured to filter out high frequency noise in the corresponding analog output voltage.

Figure 3:
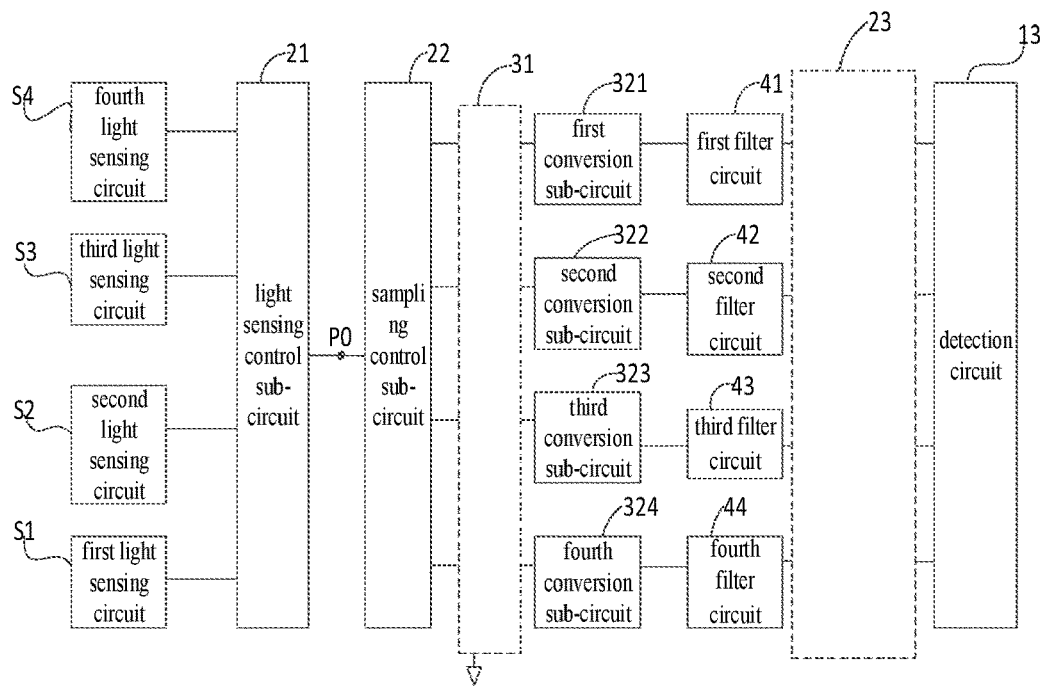
FIG. 3 is a structural diagram of a light detection module according to at least one embodiment of the present disclosure.

As shown in FIG. 3, based on at least one embodiment of the light detection module shown in FIG. 2, the switch sub-circuit 23 includes a first switch W1, a second switch W2, a third switch W3 and a fourth switch W4; the light detection module described in at least one embodiment of the present disclosure may further include a first filter circuit 41, a second filter circuit 42, a third filter circuit 43, and a fourth filter circuit 43;

The first filter circuit 41 is connected to the output end of the first conversion sub-circuit 321 and the first end of the first switch W1, and the second end of the first switch W1 is electrically connected to the detection circuit 13, the control end of the first switch W1 is electrically connected to the first switch control end K1; the first filter circuit 41 is used to filter out the high frequency noise in the analog output voltage outputted by the first conversion sub-circuit 321;

The second filter circuit 42 is connected to the output end of the second conversion sub-circuit 322 and the first end of the second switch W2, and the second end of the second switch W2 is electrically connected to the detection circuit 13; the control end of the second switch W2 is electrically connected to the second switch control end K2; the second filter circuit 42 is used to filter out the high frequency noise in the analog output voltage outputted by the second conversion sub-circuit 322;

The third filter circuit 43 is electrically connected to the output end of the third conversion sub-circuit 323 and the first end of the third switch W3, and the second end of the third switch W3 is electrically connected to the detection circuit 13, the control end of the third switch W3 is electrically connected to the control end K3 of the third switch; the third filter circuit 43 is used to filter out the high frequency noise in the analog output voltage outputted by the third conversion sub-circuit 323;

The fourth filter circuit 44 is connected to the output end of the fourth conversion sub-circuit 324 and the first end of the fourth switch W4, and the second end of the fourth switch W4 is electrically connected to the detection circuit 13, the control end of the fourth switch W4 is electrically connected to the control end K4 of the fourth switch; the fourth filter circuit 44 is used to filter out the high frequency noise in the analog output voltage outputted by the fourth conversion sub-circuit 324.

Optionally, the mth conversion sub-circuit includes an mth operational amplifier; a non-inverting input end of the mth operational amplifier is the input end of the mth conversion sub-circuit; a inverting input end of the mth operational amplifier is electrically connected to the output end of the mth operational amplifier; the output end of the mth operational amplifier is the output end of the mth conversion sub-circuit; the mth conversion sub-circuit and the mth sampling resistor form a voltage follower;

The light detection module further includes a clamping circuit;

The clamping circuit is electrically connected to the input end of the detection circuit, and the detection circuit receives the analog output voltage through the input end of the detection circuit; the clamping circuit is configured to control the potential of the input end of the detection circuit to be less than or equal to a predetermined voltage value.

In at least one embodiment of the present disclosure, the detection circuit may include an analog-to-digital converter and an output processing unit; the analog-to-digital converter is used to convert the analog output voltage into a digital output voltage; the output processing unit is connected to the analog-to-digital converter to receive the digital output voltage, and obtain the characteristics of the light signal according to the digital output voltage;

The high-precision voltage conversion range of the analog-to-digital converter is greater than or equal to the first voltage VS1 and less than or equal to the second voltage VS2; the voltage conversion range of the analog-to-digital converter is greater than or equal to the third voltage VS3 and less than or equal to the fourth voltage VS4; the third voltage VS3 is less than the first voltage VS1, the fourth voltage VS4 is greater than the second voltage VS2; the predetermined voltage value may be greater than or equal to the second voltage VS2 and less than or equal to the fourth voltage VS4, but not limited to this.

Optionally, the mth conversion sub-circuit includes an mth operational amplifier and an mth compensation capacitor; the inverting input end of the mth operational amplifier is an input end of the mth conversion sub-circuit; the non-inverting input end of the mth operational amplifier is electrically connected to the reference voltage end, and the mth compensation capacitor is connected between the inverting input end of the mth operational amplifier and the output end of the mth operational amplifier; the reference voltage end is used to provide a reference voltage; the output end of the mth operational amplifier is the output end of the mth conversion sub-circuit;

The mth conversion sub-circuit and the mth sampling resistor form an mth current-voltage converter.

In at least one embodiment of the present disclosure, the control circuit may include a light sensing control sub-circuit and a sampling control sub-circuit; the conversion circuit may include a conversion sub-circuit and a sampling sub-circuit; the sampling sub-circuit may include M samples resistors; M is a positive integer;

The light sensing control sub-circuit is configured to control to provide the photocurrents generated by these light sensing circuits to the input end of the conversion sub-circuit in time division manner under the control of the light sensing control signal;

The sampling control sub-circuit is configured to control the first ends of these sampling resistors to be connected to the input end of the conversion sub-circuit in a time division manner under the control of the sampling control signal; control the second ends of theses sampling resistors to be connected to the input end of the conversion sub-circuit;

The conversion sub-circuit is used to convert the photocurrent to obtain and output the analog output voltage through the output end of the conversion sub-circuit.

In a specific implementation, the control circuit may include a light sensing control sub-circuit and a sampling control sub-circuit, the conversion circuit may include a conversion sub-circuit and a sampling sub-circuit, the sampling sub-circuit may include M sampling resistors, the light sensing control sub-circuit provides photocurrent signals generated by these light sensing circuits to the conversion sub-circuit in a time division manner, and the sampling control sub-circuit selects and controls the sampling resistor connected to the conversion sub-circuit to control the transfer coefficient of the conversion circuit, so that the conversion sub-circuit converts the photocurrent provided by the light sensing control sub-circuit to obtain and output the corresponding analog output voltage.

Figure 4:
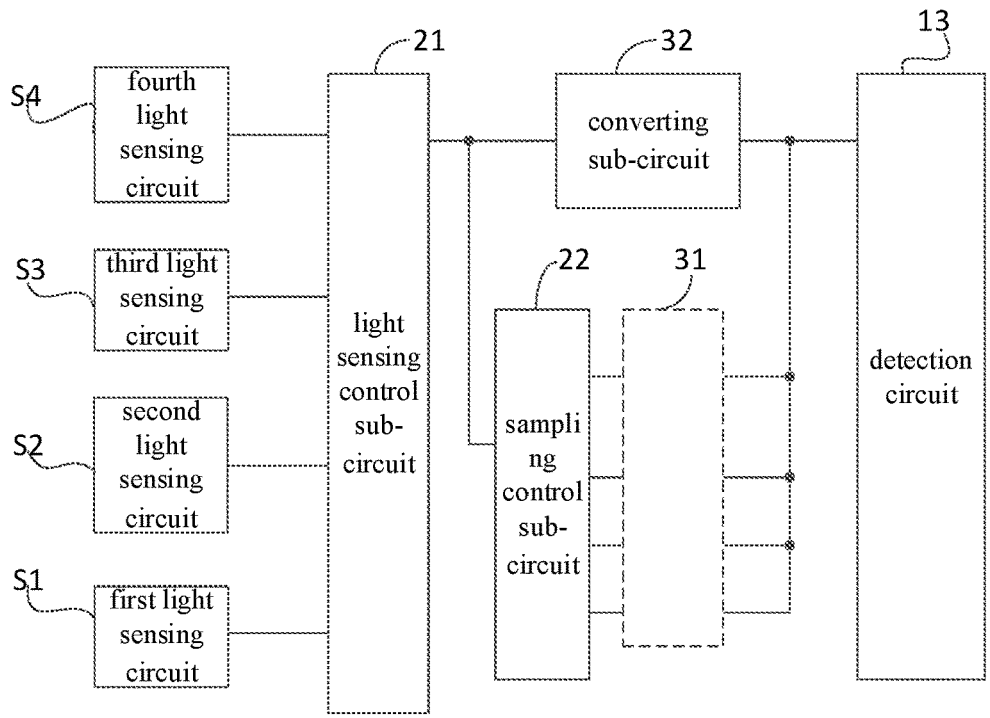
FIG. 4 is a structural diagram of a light detection module according to at least one embodiment of the present disclosure.

As shown in FIG. 4, based on at least one embodiment of the light detection module shown in FIG. 1, the control circuit may include a light sensing control sub-circuit 21 and a sampling control sub-circuit 22; the conversion circuit may include the sampling sub-circuit 31 and the converting sub-circuit 32; the sampling sub-circuit 31 may include a first sampling resistor RS1, a second sampling resistor RS2, a third sampling resistor RS3 and a fourth sampling resistor RS4;

The light sensing control sub-circuit 21 is respectively connected to the first light sensing circuit S1, the second light sensing circuit S2, the third light sensing circuit S3, the fourth light sensing circuit S4 and the sampling control sub-circuit 22, is configured to, under the control of the light sensing control signal, to control to provide the first photocurrent, the second photocurrent, the third photocurrent and the fourth photocurrent to the input end of the conversion sub-circuit 32 in a time division manner;

The sampling control sub-circuit 22 is respectively connected to the first end of the first sampling resistor RS1, the first end of the second sampling resistor RS2, the first end of the third sampling resistor RS3, the first end of the fourth sampling resistor RS4, and the input end of the conversion sub-circuit 32, and is configured to control the first end of the first sampling resistor RS1, the first end of the second sampling resistor RS2, the first end of the third sampling resistor RS3, the first end of the fourth sampling resistor RS4 to be connected to the input end of the conversion sub-circuit 32 in a time division manner under the control of the sampling control signal; the second end of the first sampling resistor RS1, the second end of the second sampling resistor RS2, the second end of the third sampling resistor RS3 and the second end of the fourth sampling resistor RS4 are electrically respectively connected to the output end of the conversion sub-circuit 32;

The conversion sub-circuit 32 is configured to convert the photocurrent to obtain and output the analog output voltage through the output end of the conversion sub-circuit 32;

The output end of the conversion sub-circuit 32 is electrically connected to the detection circuit 13 to provide the analog output voltage to the detection circuit 13.

Optionally, the light sensing control sub-circuit includes N light sensing control transistors; the sampling control sub-circuit includes M sampling control switches; n is a positive integer less than or equal to N, and m is a positive integer less than or equal to M;

The control electrode of the nth light sensing control transistor is electrically connected to the nth light sensing control end, the first electrode of the nth light sensing control transistor is electrically connected to the nth photocurrent output end, and the second electrode of the nth light sensing control transistor is electrically connected to the input end of the conversion sub-circuit; the nth light sensing control end is used for providing the nth light sensing control signal;

The control end of the mth sampling control switch is electrically connected to the mth sampling control end, the first end of the mth sampling control switch is electrically connected to the input end of the conversion sub-circuit, and the second end of the mth sampling control switch is electrically connected to the first end of the mth sampling resistor, and the second end of the mth sampling resistor is electrically connected to the output end of the conversion sub-circuit.

The light detection module described in at least one embodiment of the present disclosure further includes a filter circuit;

The filter circuit is connected between the output end of the conversion sub-circuit and the detection circuit, and is configured to filter out high-frequency noise in the analog output voltage, and provide the filtered analog output voltage to the detection circuit;

The detection circuit is configured to obtain the characteristics of the light signal according to the filtered analog output voltage.

During specific implementation, the light detection module according to at least one embodiment of the present disclosure may further include a filter circuit to filter out high-frequency noise in the analog output voltage outputted by the conversion sub-circuit, so that the detection circuit can obtain the characteristics of the light signal according to the analog output voltage after filtering out the high-frequency noise.

Figure 5:
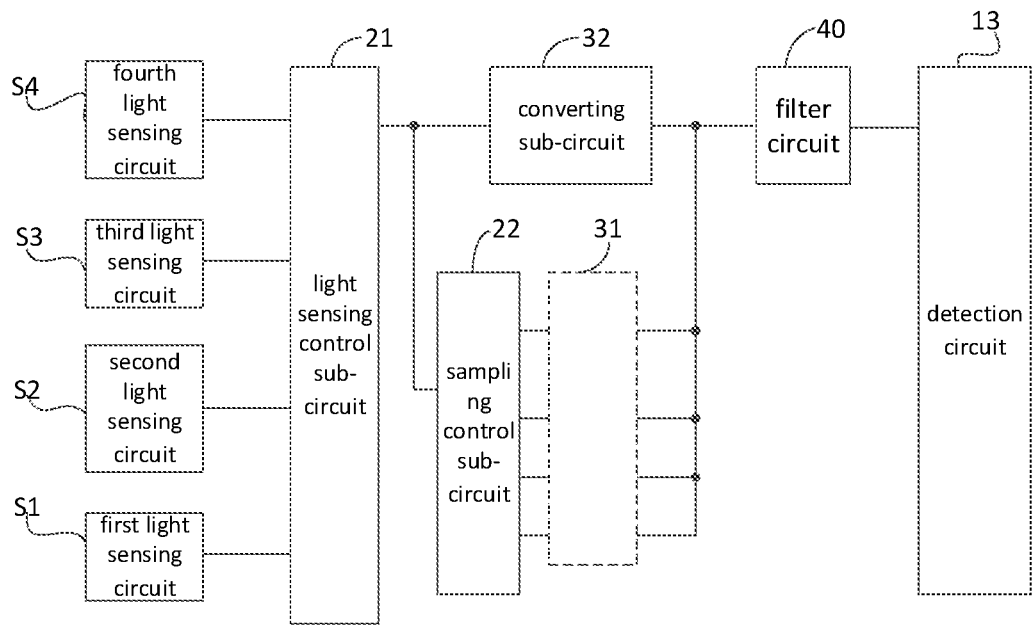
FIG. 5 is a structural diagram of a light detection module according to at least one embodiment of the present disclosure.

As shown in FIG. 5, on the basis of at least one embodiment of the light detection module shown in FIG. 4, the light detection module described in at least one embodiment of the present disclosure may further include a filter circuit 40;

The filter circuit 40 is connected between the output end of the conversion sub-circuit 32 and the detection circuit 13, and is used to filter out high-frequency noise in the analog output voltage outputted by the output end of the conversion sub-circuit 32, and provide the analog output voltage after filtering out the high frequency noise to the detection circuit 13;

The detection circuit 13 is configured to obtain the characteristics of the light signal according to the analog output voltage after filtering out the high-frequency noise.

Optionally, the conversion sub-circuit includes an operational amplifier and a compensation capacitor; the inverting input end of the operational amplifier is the input end of the conversion sub-circuit, and the non-inverting input end of the operational amplifier is electrically connected to the reference voltage end; the compensation capacitor is connected between the inverting input end of the operational amplifier and the output end of the operational amplifier; the reference voltage end is used to provide a reference voltage; the output end of the operational amplifier is the output end of the conversion sub-circuit;

The conversion sub-circuit and the sampling resistor form a current-voltage converter.

Optionally, the conversion sub-circuit includes an operational amplifier; the non-inverting input end of the operational amplifier is the input end of the conversion sub-circuit, and the inverting input end of the operational amplifier is electrically connected to the output end of the operational amplifier, the output end of the operational amplifier is the output end of the conversion sub-circuit;

The conversion sub-circuit and the sampling resistor form a voltage follower;

The light detection module further includes a clamping circuit;

The clamping circuit is electrically connected to the input end of the detection circuit, and the detection circuit receives the analog output voltage through the input end of the detection circuit; the clamping circuit is used to control the potential of the input end of the detection circuit to be less than or equal to a predetermined voltage value.

The light detection module described in at least one embodiment of the present disclosure may further include a control signal generating unit;

The control signal generating unit is configured to provide the light sensing control signal and the sampling control signal.

During specific implementation, the light detection module described in at least one embodiment of the present disclosure may further include a control signal generating unit to provide the light sensing control signal and the sampling control signal.

Optionally, the detection circuit includes an analog-to-digital converter and an output processing unit;

The analog-to-digital converter is configured to perform analog-to-digital conversion on the analog output voltage to convert the analog output voltage into a digital output voltage;

The output processing unit is electrically connected to the analog-to-digital converter, and is configured to receive the digital output voltage and obtain the characteristics of the light signal according to the digital output voltage.

Optionally, the characteristics of the light signal may include at least one of light intensity, brightness, color coordinates, and color temperature.

During specific implementation, the output processing unit performs processing on the digital output voltage, determines the validity of the digital output voltage, converts the digital output voltage into a digital signal corresponding to light intensity and brightness, and at the same time, and calculates optical parameters such as color coordinates or color temperature according to the digital output voltages corresponding to different colors.

Figure 6:
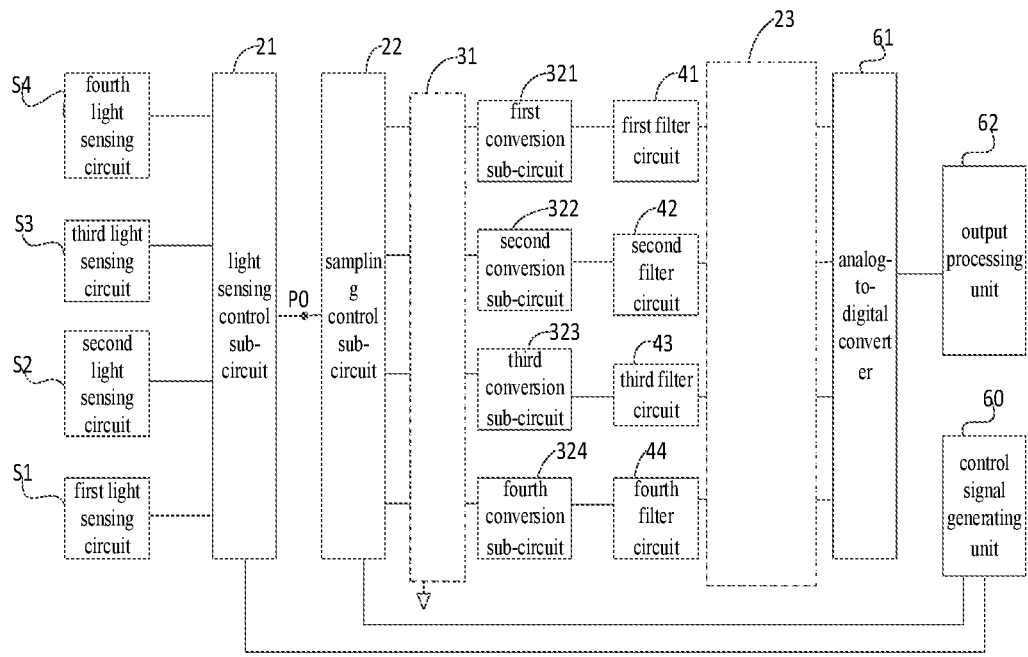
FIG. 6 is a structural diagram of a light detection module according to at least one embodiment of the present disclosure.

As shown in FIG. 6, on the basis of at least one embodiment of the light detection module shown in FIG. 3, the light detection module described in at least one embodiment of the present disclosure may further include a control signal generating unit 60; the detection circuit includes an analog-to-digital converter A0 and an output processing unit 62;

The control signal generating unit 60 is electrically connected to the light sensing control sub-circuit 21 and the sampling control sub-circuit 22, respectively, is configured to provide the light sensing control signal to the light sensing control sub-circuit 21, and provide the light sensing control to the sampling control sub-circuit 22;

The analog-to-digital converter A0 is respectively connected to the second end of the first switch W1, the second end of the second switch W2, the second end of the third switch W3 and the send end of the fourth switch W4, is configured to perform analog-to-digital conversion on the analog output voltage, so as to convert the analog output voltage into a digital output voltage;

The output processing unit 62 is electrically connected to the analog-to-digital converter A0, and is configured to receive the digital output voltage and obtain the characteristics of the light signal according to the digital output voltage.

Figure 7:
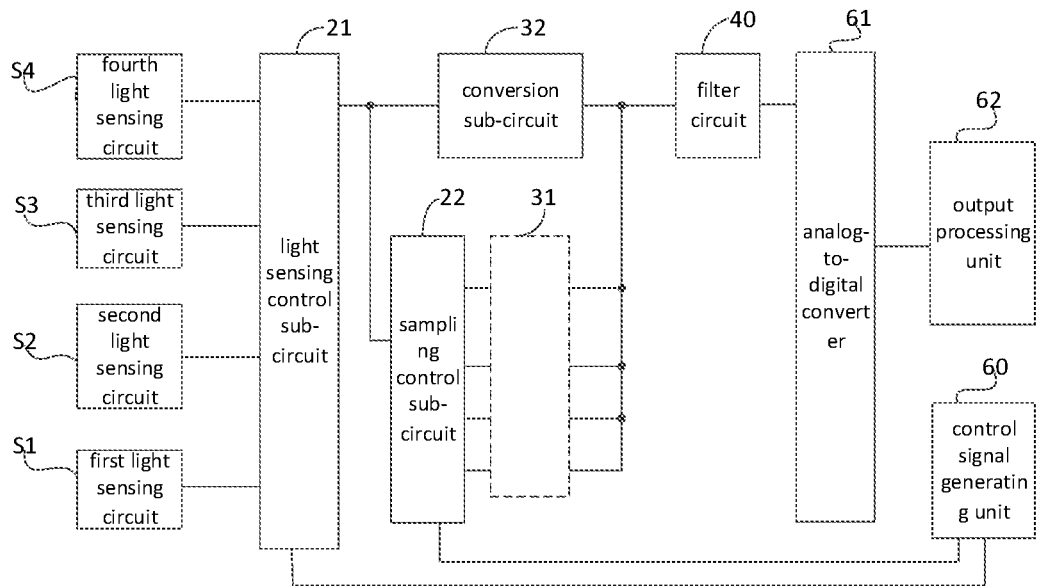
FIG. 7 is a structural diagram of a light detection module according to at least one embodiment of the present disclosure.

As shown in FIG. 7, on the basis of at least one embodiment of the light detection module shown in FIG. 5, the light detection module according to at least one embodiment of the present disclosure may further include a control signal generating unit 60; the detection circuit includes an analog-to-digital converter A0 and an output processing unit 62;

The control signal generating unit 60 is electrically connected to the light sensing control sub-circuit 21 and the sampling control sub-circuit 22, respectively, is configured to provide the light sensing control signal to the light sensing control sub-circuit 21, and provide the sampling control signal to the sampling control sub-circuit 22;

The analog-to-digital converter A0 is electrically connected to the filter circuit 40, is configured to perform analog-to-digital conversion on the analog output voltage after filtering out high-frequency noise, so as to convert the analog output voltage after filtering out the high-frequency noise to digital output voltage;

The output processing unit 62 is electrically connected to the analog-to-digital converter A0, and is configured to receive the digital output voltage and obtain the characteristics of the light signal according to the digital output voltage.

Optionally, the nth light sensing circuit includes an nth photodiode; n is a positive integer less than or equal to N;

The cathode of the nth photodiode is electrically connected to the power supply voltage end, and the anode of the nth photodiode is used to provide the nth photocurrent;

The power supply voltage end is used to provide a power supply voltage signal.

In a specific implementation, the nth light sensing circuit may include an nth photodiode, and when the potential of the cathode of the nth photodiode is greater than the potential of the anode of the nth photodiode, the nth photodiode can perform photoelectric conversion.

Figure 8:
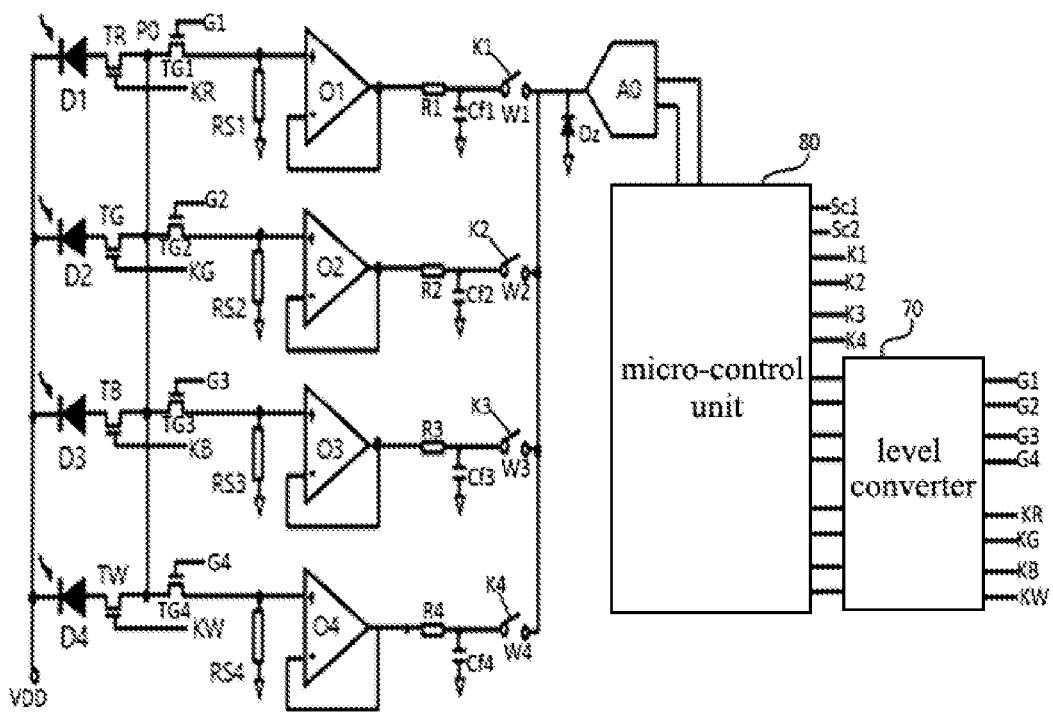
FIG. 8 is a circuit diagram of a light detection module according to at least one embodiment of the present disclosure.

As shown in FIG. 8, on the basis of at least one embodiment of the light detection module shown in FIG. 3, the light detection module described in at least one embodiment of the present disclosure may further include a control signal generating unit and a micro-control unit 80; the detection circuit includes an analog-to-digital converter A0 and an output processing unit;

The control signal generating unit includes a control signal generating circuit and a level converter 70;

The control signal generating circuit and the output processing unit are integrated in the micro-control unit 80;

The first light sensing circuit includes a first photodiode D1; the cathode of the first photodiode D1 is electrically connected to the power supply voltage end VDD, and the first photodiode D1 is configured to sense a red light signal to generate a corresponding first photocurrent;

The second light sensing circuit includes a second photodiode D2; the cathode of the second photodiode D2 is electrically connected to the power supply voltage end VDD, and the second photodiode D2 is configured to sense a green light signal to generate a corresponding second photocurrent;

The third light sensing circuit includes a third photodiode D3; the cathode of the third photodiode D3 is electrically connected to the power supply voltage end VDD, and the third photodiode D3 is configured to sense a blue light signal to generate a corresponding third photocurrent;

The fourth light sensing circuit includes a fourth photodiode D4; the cathode of the fourth photodiode D4 is electrically connected to the power supply voltage end VDD, and the fourth photodiode D4 is configured to sense a white light signal to generate a corresponding fourth photocurrent;

The light sensing control sub-circuit includes a first light sensing control transistor TR, a second light sensing control transistor TG, a third light sensing control transistor TB and a fourth light sensing control transistor TW, and the sampling control sub-circuit 22 includes a first sampling control transistor TG1, a second sampling control transistor TG2, a third sampling control transistor TG3 and a fourth sampling control transistor TG4; the first conversion sub-circuit 321 includes a first operational amplifier O1, and the second conversion sub-circuit 322 includes a second operational amplifier O2, the third conversion sub-circuit 323 includes a third operational amplifier O3, and the fourth conversion sub-circuit 324 includes a fourth operational amplifier O4;

The gate electrode of the first light sensing control transistor TR is electrically connected to the first light sensing control end KR, the source electrode of the first light sensing control transistor TR is electrically connected to the anode of the first photodiode D1, and the drain electrode of the first light sensing control transistor TR is electrically connected to the current supply end P0;

The gate electrode of the second light sensing control transistor TG is electrically connected to the second light sensing control end KG, the source electrode of the second light sensing control transistor TG is electrically connected to the anode of the second photodiode D2, and the drain electrode of the second light sensing control transistor TG is electrically connected to the current supply end P0;

The gate electrode of the third light sensing control transistor TB is electrically connected to the third light sensing control end KB, the source electrode of the third light sensing control transistor TB is electrically connected to the anode of the third photodiode D3, and the drain electrode of the third light sensing control transistor TB is electrically connected to the current supply end P0;

The gate electrode of the fourth light sensing control transistor TW is electrically connected to the fourth light sensing control end KW, the source electrode of the fourth light sensing control transistor TW is electrically connected to the anode of the fourth photodiode D4, and the drain electrode of the fourth light sensing control transistor TW is electrically connected to the current supply end P0;

The gate electrode of the first sampling control transistor TG1 is electrically connected to the first sampling control end G1, the source electrode of the first sampling control transistor TG1 is electrically connected to the current supply end P0, and the drain electrode of the first sampling control transistor TG1 is electrically connected to the non-inverting input end of the first operational amplifier O1;

The gate electrode of the second sampling control transistor TG2 is electrically connected to the second sampling control end G2, the source electrode of the second sampling control transistor TG2 is electrically connected to the current supply end P0, and the drain electrode of the second sampling control transistor TG2 is electrically connected to the non-inverting input end of the second operational amplifier O2;

The gate electrode of the third sampling control transistor TG3 is electrically connected to the third sampling control end G3, the source electrode of the third sampling control transistor TG3 is electrically connected to the current supply end P0, and the drain electrode of the third sampling control transistor TG3 is electrically connected to the non-inverting input end of the third operational amplifier O3;

The gate electrode of the fourth sampling control transistor TG4 is electrically connected to the fourth sampling control end G4, the source electrode of the fourth sampling control transistor TG4 is electrically connected to the current supply end P0, and the drain electrode of the fourth sampling control transistor TG4 is electrically connected to the non-inverting input end of the fourth operational amplifier O4;

The non-inverting input end of the first operational amplifier O1 is electrically connected to the first end of the first sampling resistor RS1;

The non-inverting input end of the second operational amplifier O2 is electrically connected to the first end of the second sampling resistor RS2;

The non-inverting input end of the third operational amplifier O3 is electrically connected to the first end of the third sampling resistor RS3;

The non-inverting input end of the fourth operational amplifier O4 is electrically connected to the first end of the fourth sampling resistor RS4;

The second end of the first sampling resistor RS1, the second end of the second sampling resistor RS2, the second end of the third sampling resistor RS3 and the second end of the fourth sampling resistor RS4 are grounded;

The inverting input end of the first operational amplifier O1 is electrically connected to the output end of the first operational amplifier O1, and the inverting input end of the second operational amplifier O2 is electrically connected to the output end of the second operational amplifier O2, the inverting input end of the third operational amplifier O3 is electrically connected to the output end of the third operational amplifier O3, and the inverting input end of the fourth operational amplifier O4 is electrically connected to the output end of the fourth operational amplifier O4;

The first operational amplifier O1 and the first sampling resistor RS1 form a first voltage follower, the second operational amplifier O2 and the second sampling resistor RS2 form a second voltage follower, and the third operational amplifier O3 and the third sampling resistor RS3 forms a third voltage follower, and the fourth operational amplifier O4 and the fourth sampling resistor RS4 form a fourth voltage follower;

The first filter circuit includes a first filter resistor R1 and a first filter capacitor Cf1;

The first end of the first filter resistor R1 is electrically connected to the output end of the first operational amplifier O1, and the second end of the first filter resistor R1 is electrically connected to the first end of the first filter capacitor Cf1, the second end of the first filter capacitor Cf1 is grounded; the second end of the first filter resistor R1 is electrically connected to the first end of the first switch W1; the control end of the first switch W1 is connected to the first switch control end K1; the second end of the first switch W1 is electrically connected to the input end of the analog-to-digital converter A0;

The second filter circuit includes a second filter resistor R2 and a second filter capacitor Cf2;

The first end of the second filter resistor R2 is electrically connected to the output end of the second operational amplifier O2, and the second end of the second filter resistor R2 is electrically connected to the first end of the second filter capacitor Cf2, the second end of the second filter capacitor Cf2 is grounded; the second end of the second filter resistor R2 is electrically connected to the first end of the second switch W2; the control end of the second switch W2 is connected to the second switch control end K2; the second end of the second switch W2 is electrically connected to the input end of the analog-to-digital converter A0;

The third filter circuit includes a third filter resistor R3 and a third filter capacitor Cf3;

The first end of the third filter resistor R3 is electrically connected to the output end of the third operational amplifier O3, and the second end of the third filter resistor R3 is electrically connected to the first end of the third filter capacitor Cf3, the second end of the third filter capacitor Cf3 is grounded; the second end of the third filter resistor R3 is electrically connected to the first end of the third switch W3; the control end of the third switch W3 is connected to the third switch control end K3; the second end of the third switch W3 is electrically connected to the input end of the analog-to-digital converter A0;

The fourth filter circuit includes a fourth filter resistor R4 and a fourth filter capacitor Cf4;

The first end of the fourth filter resistor R4 is electrically connected to the output end of the fourth operational amplifier O4, and the second end of the fourth filter resistor R4 is electrically connected to the first end of the fourth filter capacitor Cf4, the second end of the fourth filter capacitor Cf4 is grounded; the second end of the fourth filter resistor R4 is electrically connected to the first end of the fourth switch W4; the control end of the fourth switch W3 is connected to the fourth switch control end K4; the second end of the fourth switch W4 is electrically connected to the input end of the analog-to-digital converter A0;

The light detection module described in at least one embodiment of the present disclosure further includes a clamping circuit;

The clamping circuit includes a clamping diode Dz;

The cathode of the clamp diode Dz is electrically connected to the input end of the analog-to-digital converter A0, and the anode of the clamp diode Dz is grounded; the clamp diode Dz is used to ensure the potential of the input end of the analog-to-digital converter A0 to be less than or equal to the predetermined voltage value;

The output end of the analog-to-digital converter A0 is electrically connected to the micro-control unit 80;

The micro-control unit 80 is respectively electrically connected to the first switch control end K1, the second switch control end K2, the third switch control end K3 and the fourth switch control end K4, and is used to provide the first switch control signal to the first switch control end K1, provide a second switch control signal to the second switch control end K2, provide a third switch control signal to the third switch control end K3, and provide a fourth switch control signal to the fourth switch control end K4;

The micro-control unit 80 is also electrically connected to the level converter 70, is configured to provide the level shifter 70 with a first input light sensing control signal, a second input light sensing control signal, and a third input light sensing control signal, a fourth input light sensing control signal, a first input sampling control signal, a second input sampling control signal, a third input sampling control signal, and a fourth input sampling control signal;

The level converter 70 is respectively connected to the first light sensing control end KR, the second light sensing control end KG, the third light sensing control end KB, the fourth light sensing control end KW, the first sampling control end G1, the second light sensing control end G1, and the second sampling control end G2, the third sampling control end G3 and the fourth sampling control end G4, is configured to perform level conversion on the first input light sensing control signal to obtain a first light sensing control signal, and provide the first light sensing control signal to the first light sensing control end KR, and perform level conversion on the second input light sensing control signal to obtain a second light sensing control signal, and provide the second light sensing control signal to the second light sensing control end KG, perform level conversion on the third input light sensing control signal to obtain a third light sensing control signal, and provide the third light sensing control signal to the third light sensing control end KB, perform level conversion on the fourth input light sensing control signal to obtain a fourth light sensing control signal, and provide the fourth light sensing control signal to the fourth light sensing control signal end KW, perform level conversion on the first input sampling control signal to obtain a first sampling control signal, and provide the first sampling control signal to the first sampling control end G1, and perform level conversion on the second input sampling control signal to obtain a second sampling control signal, and provide the second sampling control signal to the second sampling control end G2, perform level conversion on the third input sampling control signal to obtain a third sampling control signal, and provide the third sampling control signal to the third sampling control end G3, and perform level conversion on the fourth input sampling control signal to obtain a fourth sampling control signal, and provide the fourth sampling control signal to the fourth sampling control end G4;

The micro-control unit 80 is further configured to obtain the characteristics of the corresponding light signal according to the analog output voltage provided by the analog-to-digital converter A0 through the output end thereof;

The characteristics of the light signal may include at least one of light intensity, brightness, color coordinates, and color temperature.

In at least one embodiment of the light detection module shown in FIG. 8, each photodiode, each light sensing control transistor and each sampling control transistor can be arranged on the display substrate, and each light sensing control transistor and each sampling control transistor are formed on the same time as forming the thin film transistor on the display substrate, each operational amplifier, each sampling resistor, each filter circuit, each switch, clamping diode Dz, analog-to-digital converter A0, micro-control unit 80 and level shifter 70 can be arranged on the circuit board or display drive integrated circuit.

In at least one embodiment of the light detection module shown in FIG. 8, when each light sensing control transistor and each sampling control transistor are fabricated by a thin film transistor (TFT) process, including a low temperature polysilicon (LTPS) P-type metal-oxide material-semiconductor transistor (PMOS), N-type metal-oxide-semiconductor transistor (LTPS NMOS) and indium gallium zinc oxide (IGZO) and other processes, when each light sensing control transistor and each sampling control transistor are n-type transistors, when the potential of each light sensing control signal is 7V, each light sensing control transistor is turned on; when the potential of each sampling control signal is −7V, each sampling control transistor is turned off, and when each light sensing control transistor and each sampling control transistor are p-type transistors, when the potential of each light sensing control signal is −7V, each light sensing control transistor is turned on, and when the potential of each sampling control signal is 7V, each sampling control transistor is turned off; the low voltage value and high voltage value of each control signal provided by the micro-control unit 80 are 0V and 3V respectively. At this time, the level converter 70 is required to convert the 0V voltage to −7V voltage, and convert the 3.3V voltage to 7V voltage to meet the level control requirements of each control transistor.

In at least one embodiment of the light detection module shown in FIG. 8, the micro-control unit 80 may further include a first serial output interface Sc1 and a second serial output interface Sc2, and the characteristics of the light signal is outputted to the application unit through the first serial output interface Sc1 and a second serial output interface Sc2, so that the application unit can obtain the data of the current ambient light according to the light signal;

The first serial output interface Sc1 may be a serial peripheral interface (SPI) or a bidirectional binary synchronous serial bus (I2C) interface, and the second serial output interface may be an SPI or I2C interface, but not limited thereto.

In at least one embodiment of the light detection module shown in FIG. 8, each filter circuit includes a filter resistor and a filter capacitor, but the structure of each filter circuit is not limited to the above structure, as long as the filter circuit can achieve the purpose of filtering out high-frequency noise, and the specific structure of the filtering circuit can be selected according to the actual situation;

Each filter circuit is a low-pass filter circuit, which can effectively filter out high-frequency noise, so that the output signal is stable and the noise fluctuation is reduced.

In at least one embodiment of the light detection module shown in FIG. 8, each light sensing control transistor and each sampling control transistor may be n-type transistors, but not limited thereto. In actual operation, the above transistors can also be replaced by p-type transistors.

In at least one embodiment of the light detection module shown in FIG. 8, the resistance value of the first sampling resistor RS1, the resistance value of the second sampling resistor RS2, the resistance value of the third sampling resistor RS3 and the resistance values of the fourth sampling resistor RS4 are different from each other, the resistance value of the first sampling resistor RS1 determines the amplification factor of the first voltage follower, the resistance value of the second sampling resistor RS2 determines the amplification factor of the second voltage follower, the resistance value of the third sampling resistor RS3 determines the amplification factor of the third voltage follower, and the resistance value of the fourth sampling resistor RS4 determines the amplification factor of the fourth voltage follower.

In at least one embodiment of the light detection module shown in FIG. 8, the resistance value Rz1 of RS1 may be 40 MΩ, the resistance value Rz2 of RS2 may be 4 M KΩ, the resistance value Rz3 of RS3 may be 400 KΩ, and the resistance value Rz4 of RS4 It can be 40 KΩ, but not limited to this;

During specific implementation, the resistance value of each sampling resistor can be flexibly selected according to the high-precision voltage conversion range of the analog-to-digital converter and the current value range of the photocurrent generated by the sensing photodiode. For example, if the high-precision voltage conversion range of the analog-to-digital converter is greater than or equal to 0.2V and less than or equal to 2V, there is an ideal linear relationship between the input voltage of the analog-to-digital converter and the output digital signal. When the resistance value of RS1 Rz1 is 40 MΩ, the current value range of the photocurrent that can be collected is greater than or equal to 5 nA and less than or equal to 50 nA. When the resistance value Rz2 of RS2 is 4 MΩ, the current value range of the photocurrent that can be collected is greater than or equal to 50 nA and less than or equal to 500 nA. When the resistance value Rz3 of RS3 is 400 KΩ, the current value range of the photocurrent that can be collected is greater than or equal to 500 nA and less than or equal to 5 uA. When the resistance value Rz4 of RS4 is 40 KΩ, the current value range of the photocurrent that can be collected is greater than or equal to 5 uA and less than or equal to 50 uA, and so on.

When at least one embodiment of the light detection module shown in FIG. 8 of the present disclosure is in operation, When the first sampling control transistor TG1 is turned on, the photocurrent generated by the corresponding photodiode (the current value of the photocurrent is Iz1) produces a voltage drop on the first sampling resistor RS1, and the transfer coefficient of the first voltage follower (the first voltage follower includes a first operational amplifier O1 and a first sampling resistor RS1) is equal to the resistance value Rz1 of RS1, the output voltage of the output end of the first operational amplifier O1 is equal to the voltage drop on the first sampling resistor RS1, the output voltage of the output end of the first operational amplifier O1 is equal to Iz1×Rz1;

When the second sampling control transistor TG2 is turned on, the photocurrent generated by the corresponding photodiode (the current value of the photocurrent is Iz2) produces a voltage drop on the second sampling resistor RS2, the transfer coefficient of the second voltage follower (the second voltage follower includes a second operational amplifier O2 and a second sampling resistor RS2) is equal to the resistance value Rz2 of RS2, the output voltage of the output end of the second operational amplifier O2 is equal to the voltage drop on the second sampling resistor RS2, the output voltage of the output end of the second operational amplifier O2 is equal to Iz2×Rz2;

When the third sampling control transistor TG3 is turned on, the photocurrent generated by the corresponding photodiode (the current value of the photocurrent is Iz3) generates a voltage drop on the third sampling resistor RS3, and the transfer coefficient of the third voltage follower (the third voltage follower includes a third operational amplifier O3 and a third sampling resistor RS3) is equal to the resistance value Rz3 of RS3, the output voltage of the output end of the third operational amplifier O3 is equal to the voltage drop on the third sampling resistor RS3, the output voltage of the output end of the third operational amplifier O3 is equal to Iz3×Rz3,;

When the fourth sampling control transistor TG4 is turned on, the photocurrent generated by the corresponding photodiode (the current value of the photocurrent is Iz4) produces a voltage drop on the fourth sampling resistor RS4, and the transfer coefficient of the fourth voltage follower (the fourth voltage follower includes a fourth operational amplifier O4 and a fourth sampling resistor RS4) is equal to the resistance value Rz4 of RS4, the output voltage of the output end of the fourth operational amplifier O4 is equal to the voltage drop on the fourth sampling resistor RS4, the output voltage of the output end of the fourth operational amplifier O4 is equal to Iz4×Rz4.

In at least one embodiment of the light detection module shown in FIG. 8,

The input voltage range of the analog-to-digital converter A0 is VS3-VS4. If the analog-to-digital converter A0 is an n-bit analog-to-digital converter, the voltage value corresponding to each least significant bit (LSB) can be obtained; for example, when n is equal to 16 and the input voltage range is 0-3.64V, the voltage value corresponding to each LSB is 55.5 uV. However, when the voltage connected to the input end of the analog-to-digital converter A0 is greater than or equal to VS1 and less than or equal to VS2, the digital signal converted by the analog-to-digital converter A0 has a high-precision linear relationship; where VS3<VS1<VS2<VS4.

The high-precision voltage conversion range of the analog-to-digital converter A0 is greater than or equal to the first voltage VS1 and less than or equal to the second voltage VS2, and the voltage conversion range of the analog-to-digital converter A0 is greater than or equal to the third voltage VS3 and less than or equal to the fourth voltage VS4; wherein, the third voltage VS3 is smaller than the first voltage VS1, and the fourth voltage VS4 is larger than the second voltage VS2; the fourth voltage VS4 is the maximum sampling voltage allowed to be inputted by the analog-to-digital converter A0; the first voltage VS1 may be 0.2V, the second voltage VS2 may be 2V, the third voltage VS3 may be 0V, and the fourth voltage VS4 may be 3.64V, but not limited thereto;

The predetermined voltage value can be greater than or equal to 2V and less than or equal to 3.64V, which can prevent the voltage on the input end of the analog-to-digital converter A0 from being too high and damage the analog-to-digital converter A0; then the range of Iz1 that can be accurately detected is greater than or equal to VS1/Rz1 but less than or equal to VS2/Rz1, the range of Iz2 that can be accurately detected is VS1/Rz2 and less than or equal to VS2/Rz2, and the range of Iz3 that can be accurately detected is greater than or equal to VS1/Rz3 and less than or equal to VS2/Rz3, the range of Iz4 that can be accurately detected is VS1/Rz4 and less than or equal to VS2/Rz4.

Assuming that the number of bits of the digital output voltage outputted by the analog-to-digital converter A0 is n (n is a positive integer, for example, n can be equal to 16, but not limited thereto), the analog-to-digital converter A0 can output 2n digital output voltages, when the first voltage follower is in operation, the difference between the current values of the photocurrents corresponding to two adjacent digital output voltages (that is, the minimum collecting current accuracy) is VS4/(Rz1×2n); when the second voltage follower is in operation, the difference between the current values of the photocurrents corresponding to two adjacent digital output voltages (that is, the minimum collecting current accuracy) is VS4/(Rz2×2n); when the third voltage follower is in operation, the difference between the current values of the photocurrents corresponding to two adjacent digital output voltages (that is, the minimum collecting current accuracy) is VS4/(Rz3×2n); when the fourth voltage follower is in operation, the difference between the current values of the photocurrents corresponding to the two adjacent digital output voltages (that is, the minimum collecting current accuracy) is VS4/(Rz4×2n);

On the other hand, since the photocurrent outputted by each photodiode is very small, the leakage current of the non-inverting and inverting input ends of the operational amplifier needs to be considered. The non-inverting and inverting input ends of an ideal operational amplifier have the concept of virtual break, that is, the current to the non-inverting and inverting input ends of the operational amplifier is 0, thereby ensuring that all the photocurrent generated by the photodiode flows through the sampling resistor. However, in actual use, there is leakage current between the non-inverting and inverting input ends of the operational amplifier, and the leakage current flowing through the sampling resistor includes the influence of the leakage current of the operational amplifier, which affects the sampling accuracy. Generally, the leakage current of the non-inverting and inverting input ends of the operational amplifier is required to be less than an order of magnitude of the minimum acquisition current accuracy, for example, the order of magnitude can be one tenth. The smaller the leakage current of the non-inverting and inverting input ends of the operational amplifier is, the higher the collecting accuracy is.

In at least one embodiment of the light detection module shown in FIG. 8, the clamping diode Dz is used to clamp the potential of the input end of the analog-to-digital converter A0 within the voltage conversion range, generally the breakdown voltage of the clamping diode Dz is greater than or equal to VS3 and less than or equal to VS4, which not only ensures the conversion accuracy of the analog-to-digital converter A0 when its input voltage is greater than or equal to VS1 but less than or equal to VS2, but also prevents the output voltage of the conversion circuit from being higher than the fourth voltage VS4 to damage the analog-to-digital converter A0.

The light detection module described in at least one embodiment of the present disclosure uses the resistance sampling method to detect the photodiode integrated on the display panel, and the photocurrent that can be detected reaches the uA level. The circuit of the light detection module described in at least one embodiment of the present disclosure is simple, reliable and low in cost.

Figure 9:
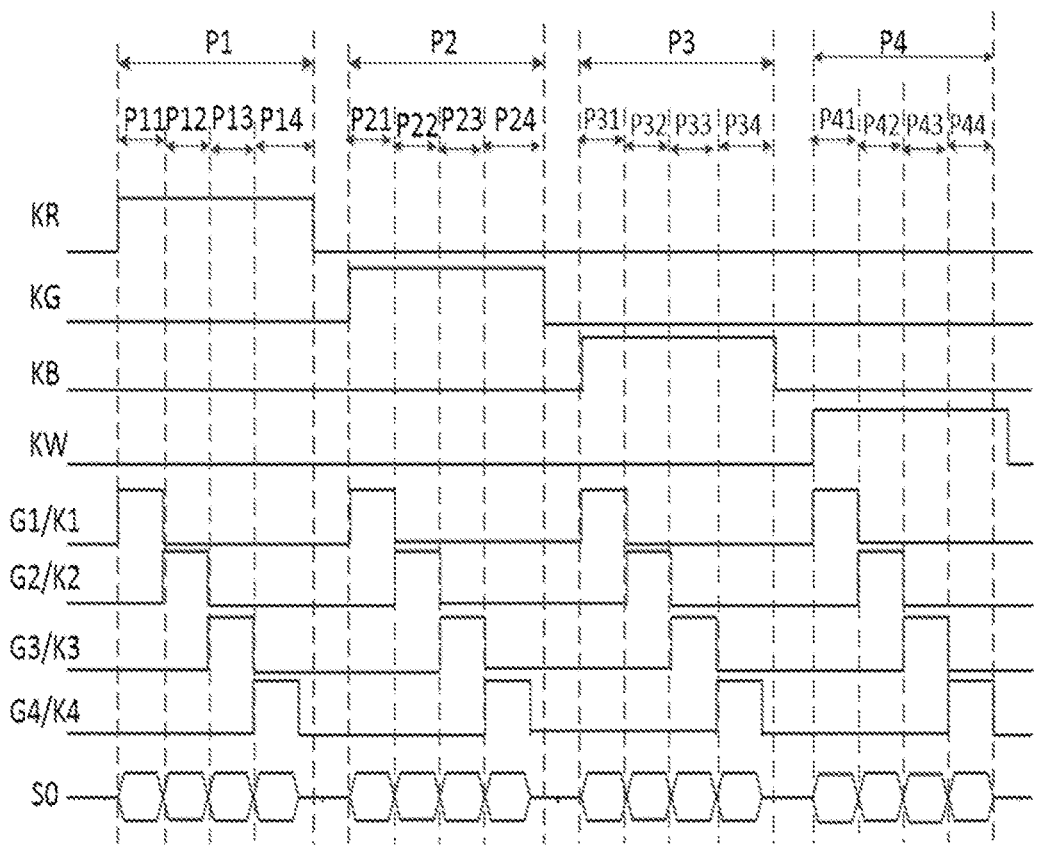
FIG. 9 is a timing sequence diagram of the light detection module shown in FIG. 8.

As shown in FIG. 9, when the light detection module of at least one embodiment of the present disclosure as shown in FIG. 8 is in operation, the sampling time period may include a first sampling phase P1, a second sampling phase P2, and a third sampling phase P3 and the fourth sampling phase P4 that are set successively;

The first sampling phase PI may include a first sampling period P11, a second sampling period P12, a third sampling period P13 and a fourth sampling period P14 that are set successively;

The second sampling phase P2 may include a fifth sampling period P21, a sixth sampling period P22, a seventh sampling period P23 and an eighth sampling period P24 that are set successively;

The third sampling phase P3 may include a ninth sampling period P31, a tenth sampling period P32, an eleventh sampling period P33 and a twelfth sampling period P24 that are set successively;

The fourth sampling phase P4 may include the thirteenth sampling period P41, the fourteenth sampling period P42, the fifteenth sampling period P43 and the sixteenth sampling period P44 that are set successively;

In the first sampling period P11, KR provides a high voltage signal, G1 and K1 both provide a high voltage signal, TR, TG1 and WI are all turned on, KG, KB and KW all provide a low voltage signal, G2, G3, G4, K2, K3 and K4 all provide a low voltage signal, TG, TB, TW, TG2, TG3, TG4, W2, W3 and W4 are all turned off, the first photodiode D1 is used to sense the red light signal to generate the corresponding first photocurrent, the first photocurrent is transmitted to the non-inverting input end of the first operational amplifier O1 through TR and TG1 that are turned on, and the first operational amplifier O1 outputs the first first analog output voltage, filter out the high-frequency noise in the first first analog output voltage through R1 and Cf1, and transmit the first first analog output voltage after filtering out the noise to the input end of the analog-to-digital converter A0 through W1, so the analog-to-digital converter A0 performs analog-to-digital conversion on the first first analog output voltage after filtering out the noise to obtain the first first digital output voltage, and outputs the first first digital output voltage to the micro-control unit 80;

In the second sampling period P12, KR provides a high voltage signal, G2 and K2 both provide a high voltage signal, TR, TG2 and W2 are all turned on, KG, KB and KW all provide a low voltage signal, G1, G3, G4, K1, K3 and K4 all provide a low voltage signal, TG, TB, TW, TG1, TG3, TG4, W1, W3 and W4 are all turned off, the first photodiode D1 is used to sense the red light signal to generate the corresponding first photocurrent, the first photocurrent is transmitted to the non-inverting input end of the second operational amplifier O2 through TR and TG2 that are turned on, and the second operational amplifier O2 outputs the second first analog output voltage, filter out the high-frequency noise in the second first analog output voltage through R2 and Cf2, and transmit the second first analog output voltage after filtering out the noise to the input end of the analog-to-digital converter A0 through W2, so the analog-to-digital converter A0 performs analog-to-digital conversion on the second first analog output voltage after filtering out the noise to obtain a second first digital output voltage, and outputs the second first digital output voltage to the micro-control unit 80;

In the third sampling period P13, KR provides a high voltage signal, G3 and K3 both provide a high voltage signal, TR, TG3 and W3 are all turned on, KG, KB and KW all provide a low voltage signal, G1, G2, G4, K1, K2 and K4 all provide a low voltage signal, TG, TB, TW, TG1, TG2, TG4, W1, W2 and W4 are all turned off, the first photodiode D1 is used to sense the red light signal to generate the corresponding first photocurrent, the first photocurrent is transmitted to the non-inverting input end of the third operational amplifier O3 through the turned-on TR and TG3, and the third operational amplifier O3 outputs the third first analog output voltage, filter out the high-frequency noise in the third first analog output voltage through R3 and Cf3, and transmit the third first analog output voltage after filtering out the noise to the input end of the analog-to-digital converter A0 through W3, so the analog-to-digital converter A0 performs analog-to-digital conversion on the third first analog output voltage after filtering out the noise to obtain a third first digital output voltage, and outputs the third first digital output voltage to the micro-control unit 80;

In the fourth sampling period P14, KR provides a high voltage signal, G4 and K4 both provide a high voltage signal, TR, TG4 and W4 are all turned on, KG, KB and KW all provide a low voltage signal, G1, G2, G3, K1, K2 and K3 all provide a low voltage signal, TG, TB, TW, TG1, TG2, TG3, W1, W2 and W3 are all turned off, the first photodiode D1 is used to sense the red light signal to generate the corresponding first photocurrent, the first photocurrent is transmitted to the non-inverting input end of the fourth operational amplifier O4 through the turned-on TR and TG4, and the fourth operational amplifier O4 outputs the fourth first analog output voltage, filter out the high-frequency noise in the fourth first analog output voltage through R4 and Cf4, and transmit the fourth first analog output voltage after filtering out the noise to the input end of the analog-to-digital converter A0 through W4, so the analog-to-digital converter A0 performs analog-to-digital conversion on the fourth first analog output voltage after filtering the noise to obtain a fourth first digital output voltage, and outputs the fourth first digital output voltage to the micro-control unit 80;

In the fifth sampling period P21, KG provides a high voltage signal, G1 and K1 both provide a high voltage signal, TG, TG1 and W1 are all turned on, KR, KB and KW all provide a low voltage signal, G2, G3, G4, K2, K3 and K4 all provide a low voltage signal, TR, TB, TW, TG2, TG3, TG4, W2, W3 and W4 are all turned off, the second photodiode D1 is used to sense the green light signal to generate the corresponding second photocurrent, the second photocurrent is transmitted to the non-inverting input end of the first operational amplifier O1 through TG and TG1 that are turned on, and the first operational amplifier O1 outputs the first second analog output voltage, filter out the high-frequency noise in the first second analog output voltage through R1 and Cf1, and transmit the first second analog output voltage after filtering out the noise to the input end of the analog-to-digital converter A0 through W1, so the analog-to-digital converter A0 performs analog-to-digital conversion on the first second analog output voltage after filtering out the noise to obtain the first second digital output voltage, and outputs the first second digital output voltage to the micro-control unit 80;

In the sixth sampling period P22, KG provides a high voltage signal, G2 and K2 both provide a high voltage signal, TG, TG2 and W2 are all turned on, KR, KB and KW all provide a low voltage signal, G1, G3, G4, K1, K3 and K4 all provide a low voltage signal, TR, TB, TW, TG1, TG3, TG4, W1, W3 and W4 are all turned off, the second photodiode D2 is used to sense the green light signal to generate the corresponding second photocurrent, the second photocurrent is transmitted to the non-inverting input end of the second operational amplifier O2 through TG and TG2 that are turned on, and the second operational amplifier O2 outputs the second second analog output voltage, filter out the high-frequency noise in the second second analog output voltage through R2 and Cf2, and transmit the second second analog output voltage after filtering out the noise to the input end of the analog-to-digital converter A0 through W2, so the analog-to-digital converter A0 performs analog-to-digital conversion on the second second analog output voltage after filtering out the noise to obtain a second second digital output voltage, and outputs the second second digital output voltage to the micro-control unit 80;

In the seventh sampling period P23, KG provides a high voltage signal, G3 and K3 both provide a high voltage signal, TG, TG3 and W3 are all turned on, KR, KB and KW all provide a low voltage signal, G1, G2, G4, K1, K2 and K4 all provide a low voltage signal, TR, TB, TW, TG1, TG2, TG4, W1, W2 and W4 are all turned off, the second photodiode D2 is used to sense the green light signal to generate the corresponding second photocurrent, the second photocurrent is transmitted to the non-inverting input end of the third operational amplifier O3 through TG and TG3 that are turned on, and the third operational amplifier O3 outputs the third second analog output voltage, filter out the high-frequency noise in the third second analog output voltage through R3 and Cf3, and transmit the third second analog output voltage after filtering out the noise to the input end of the analog-to-digital converter A0 through W3, so the analog-to-digital converter A0 performs analog-to-digital conversion on the third second analog output voltage after filtering out the noise to obtain a third second digital output voltage, and outputs the third second digital output voltage to the micro-control unit 80;

In the eighth sampling period P24, KG provides a high voltage signal, G4 and K4 both provide a high voltage signal, TG, TG4 and W4 are all turned on, KR, KB and KW all provide a low voltage signal, G1, G2, G3, K1, K2 and K3 all provide a low voltage signal, TR, TB, TW, TG1, TG2, TG3, W1, W2 and W3 are all turned off, the second photodiode D2 is used to sense the green light signal to generate the corresponding second photocurrent, the second photocurrent is transmitted to the non-inverting input end of the fourth operational amplifier O4 through TG and TG4 that are turned on, and the fourth operational amplifier O4 outputs the fourth second analog output voltage, filter out the high-frequency noise in the fourth second analog output voltage through R4 and Cf4, and transmit the fourth second analog output voltage after filtering out the noise to the input end of the analog-to-digital converter A0 through W4, so the analog-to-digital converter A0 performs analog-to-digital conversion on the fourth second analog output voltage after filtering out the noise to obtain a fourth second digital output voltage, and outputs the fourth second digital output voltage to the micro-control unit 80;

In the ninth sampling period P31, KB provides a high voltage signal, G1 and K1 both provide a high voltage signal, TB, TG1 and W1 are all turned on, KR, KG and KW all provide a low voltage signal, G2, G3, G4, K2, K3 and K4 all provide a low voltage signal, TR, TG, TW, TG2, TG3, TG4, W2, W3 and W4 are all turned off, the third photodiode D3 is used to sense the blue light signal to generate the corresponding third photocurrent, the third photocurrent is transmitted to the non-inverting input end of the first operational amplifier O1 through TB and TG1 that are turned on, and the first operational amplifier O1 outputs the first third analog output voltage, filter out the high-frequency noise in the first third analog output voltage through R1 and Cf1, and transmit the first third analog output voltage after filtering out the noise to the input end of the analog-to-digital converter A0 through W1, so the analog-to-digital converter A0 performs analog-to-digital conversion on the first third analog output voltage after filtering out the noise to obtain the first third digital output voltage, and outputs the first third digital output voltage to the micro-control unit 80;

In the tenth sampling period P32, KB provides a high voltage signal, G2 and K2 both provide a high voltage signal, TB, TG2 and W2 are all turned on, KR, KG and KW all provide a low voltage signal, G1, G3, G4, K1, K3 and K4 all provide a low voltage signal, TR, TG, TW, TG1, TG3, TG4, W1, W3 and W4 are all turned off, the third photodiode D3 is used to sense the blue light signal to generate the corresponding third photocurrent, the third photocurrent is transmitted to the non-inverting input end of the second operational amplifier O2 through TB and TG2 that are turned on, and the second operational amplifier O2 outputs the second third analog output voltage, filter out the high-frequency noise in the second third analog output voltage through R2 and Cf2, and transmit the second third analog output voltage after filtering out the noise to the input end of the analog-to-digital converter A0 through W2, so the analog-to-digital converter A0 performs analog-to-digital conversion on the second third analog output voltage after filtering out the noise to obtain a second third digital output voltage, and outputs the second third digital output voltage to the micro-control unit 80;

In the eleventh sampling period P33, KB provides a high voltage signal, G3 and K3 both provide a high voltage signal, TB, TG3 and W3 are all turned on, KR, KG and KW all provide a low voltage signal, G1, G2, G4, K1, K2 and K4 all provide a low voltage signal, TR, TG, TW, TG1, TG2, TG4, W1, W2 and W4 are all turned off, the third photodiode D3 is used to sense the blue light signal to generate the corresponding third photocurrent, the third photocurrent is transmitted to the non-inverting input end of the third operational amplifier O3 through TB and TG3 that are turned on, and the third operational amplifier O3 outputs a third third analog output voltage, filters out the high-frequency noise in the third third analog output voltage through R3 and Cf3, and transmits the third third analog output voltage after filtering out the noise to the input end of the analog-to-digital converter A0 through W3, the analog-to-digital converter A0 performs analog-to-digital conversion on the third third analog output voltage after filtering out the noise to obtain a third third digital output voltage, and outputs the third third digital output voltage to the micro-control unit 80;

In the twelfth sampling period P34, KB provides a high voltage signal, G4 and K4 both provide a high voltage signal, TB, TG4 and W4 are all turned on, KR, KG and KW all provide a low voltage signal, G1, G2, G3, K1, K2 and K3 all provide a low voltage signal, TR, TG, TW, TG1, TG2, TG3, W1, W2 and W3 are all turned off, the third photodiode D3 is used to sense the blue light signal to generate the corresponding third photocurrent, the third photocurrent is transmitted to the non-inverting input end of the fourth operational amplifier O4 through the conductive TB and TG4, and the fourth operational amplifier O4 outputs a fourth third analog output voltage, filters out the high-frequency noise in the fourth third analog output voltage through R4 and Cf4, and transmits the fourth third analog output voltage after filtering out the noise to the input end of the analog-to-digital converter A0 through W4, the analog-to-digital converter A0 performs analog-to-digital conversion on the fourth third analog output voltage after filtering out the noise to obtain a fourth third digital output voltage, and outputs the fourth third digital output voltage to the micro-control unit 80;

In the thirteenth sampling period P41, KW provides a high voltage signal, G1 and K1 both provide a high voltage signal, TW, TG1 and W1 are all turned on, KR, KG and KB all provide a low voltage signal, G2, G3, G4, K2, K3 and K4 all provide a low voltage signal, TR, TG, TB, TG2, TG3, TG4, W2, W3 and W4 are all turned off, the fourth photodiode D4 is used to sense the white light signal to generate the corresponding fourth photocurrent, the fourth photocurrent is transmitted to the non-inverting input end of the first operational amplifier O1 through TW and TG1 that are turned on, and the first operational amplifier 1 outputs the first fourth analog output voltage, filters out the high-frequency noise in the first fourth analog output voltage through R1 and Cf1, and transmits the first fourth analog output voltage after filtering out the noise to the input end of the analog-to-digital converter A0 through W1, the analog-to-digital converter A0 performs analog-to-digital conversion on the first fourth analog output voltage after filtering out the noise to obtain the first fourth digital output voltage, and outputs the first fourth digital output voltage to the micro-control unit 80;

In the fourteenth sampling period P42, KW provides a high voltage signal, G2 and K2 both provide a high voltage signal, TW, TG2 and W2 are all turned on, KR, KG and KB all provide a low voltage signal, G1, G3, G4, K1, K3 and K4 all provide a low voltage signal, TR, TG, TB, TG1, TG3, TG4, W1, W3 and W4 are all turned off, the fourth photodiode D4 is used to sense the white light signal to generate the corresponding fourth photocurrent, the fourth photocurrent is transmitted to the non-inverting input end of the second operational amplifier O2 through TW and TG2 that are turned on, and the second operational amplifier O2 outputs the second fourth analog output voltage, filters out the high-frequency noise in the second fourth analog output voltage through R2 and Cf2, and transmits the second fourth analog output voltage after filtering out the noise to the input end of the analog-to-digital converter A0 through W2, the analog-to-digital converter A0 performs analog-to-digital conversion on the second fourth analog output voltage after filtering out the noise to obtain a second fourth digital output voltage, and outputs the second fourth digital output voltage to the micro-control unit 80;

In the fifteenth sampling period P43, KG provides a high voltage signal, G3 and K3 both provide a high voltage signal, TW, TG3 and W3 are all turned on, KR, KG and KB all provide a low voltage signal, G1, G2, G4, K1, K2 and K4 all provide a low voltage signal, TR, TG, TB, TG1, TG2, TG4, W1, W2 and W4 are all turned off, the fourth photodiode D4 is used to sense the white light signal to generate the corresponding third photocurrent, the third photocurrent is transmitted to the non-inverting input end of the third operational amplifier O3 through TW and TG3 that are turned on, and the third operational amplifier O3 outputs the third fourth analog output voltage, filtering out the high-frequency noise in the third fourth analog output voltage through R3 and Cf3, and transmitting the third fourth analog output voltage after filtering out the noise to the input end of the analog-to-digital converter A0 through W3, the analog-to-digital converter A0 performs analog-to-digital conversion on the third fourth analog output voltage after filtering out noise to obtain a third fourth digital output voltage, and outputs the third fourth digital output voltage to the micro-control unit 80;

In the sixteenth sampling period P44, KG provides a high voltage signal, G4 and K4 both provide a high voltage signal, TW, TG4 and W4 are all turned on, KR, KG and KB all provide a low voltage signal, G1, G2, G3, K1, K2 and K3 all provide a low voltage signal, TR, TG, TB, TG1, TG2, TG3, W1, W2 and W3 are all turned off, the fourth photodiode D4 is used to sense the white light signal to generate the corresponding third photocurrent, the third photocurrent is transmitted to the non-inverting input end of the fourth operational amplifier O4 through TW and TG4 that are turned on, and the fourth operational amplifier O4 outputs a fourth fourth analog output voltage, filtering out the high-frequency noise in the fourth fourth analog output voltage through R4 and Cf4, and transmitting the fourth fourth analog output voltage after filtering out the noise to the input end of the analog-to-digital converter A0 through W4, the analog-to-digital converter A0 performs analog-to-digital conversion on the fourth fourth analog output voltage after filtering out the noise to obtain a fourth fourth digital output voltage, and outputs the fourth fourth digital output voltage to the micro-control unit 80.

In FIG. 9, S0 is the digital output voltage outputted by the analog-to-digital converter A0.

During operation of the light detection module shown in FIG. 8 of at least one embodiment of the present disclosure, a sampling period includes a first sampling phase, a second sampling phase, a third sampling phase, and a fourth sampling phase. The first photocurrent corresponding to the red light signal is sampled in the first sampling phase, the second photocurrent corresponding to the green light signal is sampled in the second sampling phase, the third photocurrent corresponding to the blue light signal is sampled in the third sampling phase, and the fourth photocurrent corresponding to the white light signal is sampled in the fourth sampling phase;

Each sampling phase includes four sampling periods set in sequence. In the four sampling periods set in sequence, the first voltage follower (including the first operational amplifier O1 and the first sampling resistor RS1), the second voltage follower (including the second operational amplifier O2 and the second sampling resistor RS2), the third voltage follower (including the third operational amplifier O3 and the third sampling resistor RS3), the fourth voltage follower (including the fourth operational amplifier O4 and the third A sampling resistor RS4) are controlled to sequentially sample the corresponding photocurrents, wherein the amplification factor of the first voltage follower, the amplification factor of the second voltage follower, the amplification factor of the third voltage follower and the amplification factor of the fourth voltage follower are sequentially reduced, and the digital output voltage outputted by the analog-to-digital converter A0 is evaluated, when the digital output voltage outputted by the analog-to-digital converter A0 is greater than or equal to the second voltage VS2 (the high-precision voltage conversion range of the analog-to-digital converter is greater than or equal to the first voltage VS1 and less than or equal to the second voltage VS2), then output result of the corresponding voltage follower is discarded, until the analog output voltage outputted by one of the voltage followers is within the high-precision voltage conversion range of the analog-to-digital converter, the amplification factor of the voltage follower is recorded, and the digital output voltage outputted by the analog converter A0 is stored in the corresponding storage unit. After the entire sampling time period is completed, the micro-control unit 80 can obtain the characteristics of each light signal according to the amplification factor and the digital output voltage in the storage unit.

In the light detection module shown in FIG. 8 of at least one embodiment of the present disclosure, the resistance value Rz1 of RS1 may be 40 MΩ, the resistance value Rz2 of RS2 may be 4 MΩ, the resistance value Rz3 of RS3 may be 400 KΩ, and the resistance value Rz4 of RS4 may be 40 KΩ; the voltage conversion range of the analog-to-digital converter A0 is greater than or equal to 0.2V and less than or equal to 2.0V;

The analog-to-digital converter A0 converts the voltage of one LSB to V4/216=3.64/216=55.5 uV, wherein the LSB is the least significant bit;

When the first operational amplifier O1 is in operation, the corresponding photocurrent range is greater than or equal to 0.5 nA to 50 nA, and the sampling accuracy is 1.1 pA/LSB;

When the second operational amplifier O2 is in operation, the corresponding photocurrent range is greater than or equal to 50 A to 500 nA, and the sampling accuracy is 11 pA/LSB;

When the third operational amplifier O3 is in operation, the corresponding photocurrent range is greater than or equal to 1500 nA to 5 uA, and the sampling accuracy is 110 pA/LSB;

When the fourth operational amplifier O4 is in operation, the corresponding photocurrent range is greater than or equal to 5 uA to 50 uA, and the sampling accuracy is 1.1 nA/LSB;

It can be seen from the above that the collected photocurrent ranges from 0.5 nA to 50 uA, and the sampling accuracy is related to the OS leakage current of the operational amplifier (the OS leakage current of the operational amplifier is the leakage current of the non-inverting and inverting input ends of the operational amplifier). When the required sampling error is 10%, the OS leakage current of the operational amplifier is at least one order of magnitude smaller, that is, the OS leakage current is less than 50 pA.

Figure 10:
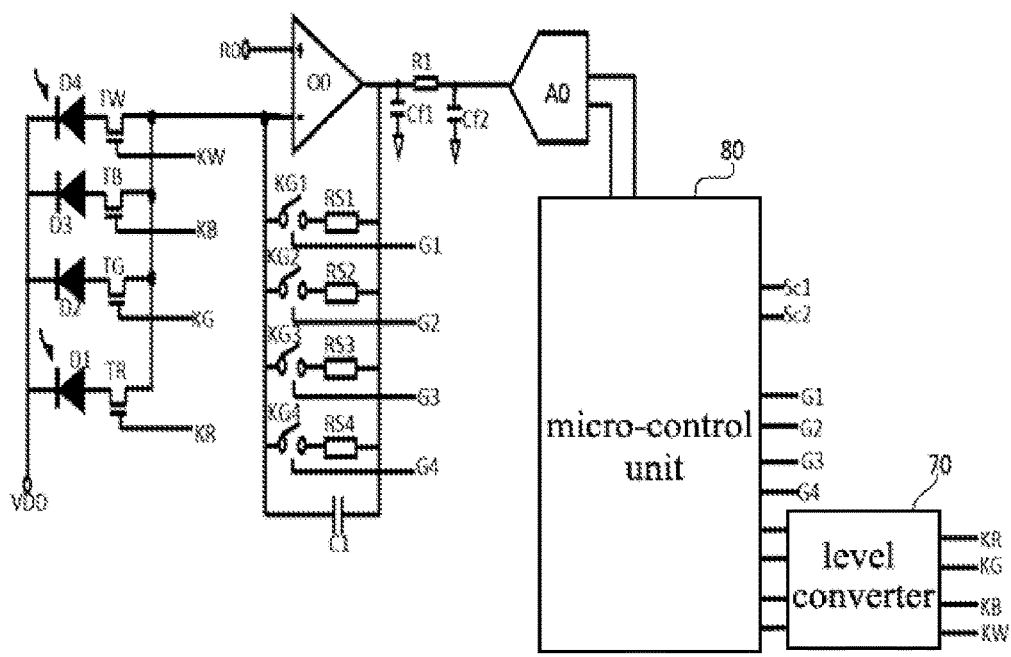
FIG. 10 is a circuit diagram of a light detection module according to at least one embodiment of the present disclosure.

As shown in FIG. 10, on the basis of the light detection module shown in FIG. 5, the light detection module described in at least one embodiment of the present disclosure may further include a control signal generating unit and a micro-control unit 80; the detection circuit includes an analog-to-digital converter A0 and an output processing unit;

The control signal generating unit includes a control signal generating circuit and a level shifter 70;

The control signal generating circuit and the output processing unit are integrated in the micro-control unit 80;

The first light sensing circuit includes a first photodiode D1; the cathode of the first photodiode D1 is electrically connected to the power supply voltage end VDD, and the first photodiode D1 is configured to sense a red light signal to generate a corresponding first photocurrent; the first photocurrent output end is electrically connected to the anode of the first photodiode D1;

The second light sensing circuit includes a second photodiode D2; the cathode of the second photodiode D2 is electrically connected to the power supply voltage end VDD, and the second photodiode D2 is configured to sense a green light signal to generate a corresponding second photocurrent; the second photocurrent output end is electrically connected to the anode of the second photodiode D2;

The third light sensing circuit includes a third photodiode D3; the cathode of the third photodiode D3 is electrically connected to the power supply voltage end VDD, and the third photodiode D3 is configured to sense a blue light signal to generate a corresponding third photocurrent; the third photocurrent output end is electrically connected to the anode of the third photodiode D3;

The fourth light sensing circuit includes a fourth photodiode D4; the cathode of the fourth photodiode D4 is electrically connected to the power supply voltage end VDD, and the fourth photodiode D4 is configured to sense a white light signal to generate a corresponding fourth photocurrent; the fourth photocurrent output end is electrically connected to the anode of the fourth photodiode D4;

The conversion sub-circuit includes an operational amplifier O0 and a compensation capacitor C1;

The non-inverting input end of the operational amplifier O0 is electrically connected to the reference voltage end R0, the reference voltage end R0 is used for providing the reference voltage Vr, and the voltage value of the reference voltage Vr is 2V;

The first end of the compensation capacitor C1 is electrically connected to the inverting input end of the operational amplifier O0, and the second end of the compensation capacitor C1 is electrically connected to the output end of the operational amplifier O0;

The light sensing control sub-circuit 21 includes a first light sensing control transistor TR, a second light sensing control transistor TG, a third light sensing control transistor TB and a fourth light sensing control transistor TW; the sampling control sub-circuit 22 includes a first sampling control switch KG1, a second sampling control switch KG2, a third sampling control switch KG3 and a fourth sampling control switch KG4;

The gate electrode of the first light sensing control transistor TR is electrically connected to the first light sensing control end KR, the source electrode of the first light sensing control transistor TR is electrically connected to the first photocurrent output end, and the drain electrode of the first light sensing control transistor TR is electrically connected to the inverting input end of the operational amplifier O0; the first light sensing control end KR is used to provide a first light sensing control signal;

The gate electrode of the second light sensing control transistor TG is electrically connected to the second light sensing control end KG, the source electrode of the second light sensing control transistor TG is electrically connected to the second photocurrent output end, and the drain electrode of the second light sensing control transistor TG is electrically connected to the inverting input end of the operational amplifier O0; the second light sensing control end KG is used to provide a second light sensing control signal;

The gate electrode of the third light sensing control transistor TB is electrically connected to the third light sensing control end KB, the source electrode of the third light sensing control transistor TB is electrically connected to the third photocurrent output end, and the drain electrode of the third light sensing control transistor TB is electrically connected to the inverting input end of the operational amplifier O0; the third light sensing control end KB is used to provide a third light sensing control signal;

The gate electrode of the fourth light sensing control transistor TW is electrically connected to the fourth light sensing control end KW, the source electrode of the fourth light sensing control transistor TW is electrically connected to the fourth photocurrent output end, and the drain electrode of the fourth light sensing control transistor TW is electrically connected to the inverting input end of the operational amplifier O0; the fourth light sensing control end KW is used to provide a fourth light sensing control signal;

The control end of the first sampling control switch KG1 is electrically connected to the first sampling control end G1, the first end of the first sampling control switch KG1 is electrically connected to the inverting input end of the operational amplifier O0, and the second end of the first sampling control switch KG1 is electrically connected to the first end of the first sampling resistor RS1;

The control end of the second sampling control switch KG2 is electrically connected to the second sampling control end G2, the first end of the second sampling control switch KG2 is electrically connected to the inverting input end of the operational amplifier O0, and the second end of the second sampling control switch KG2 is electrically connected to the first end of the second sampling resistor RS2;

The control end of the third sampling control switch KG3 is electrically connected to the third sampling control end G3, the first end of the third sampling control switch KG3 is electrically connected to the inverting input end of the operational amplifier O0, and the second end of the third sampling control switch KG3 is electrically connected to the first end of the third sampling resistor RS3;

The control end of the fourth sampling control switch KG4 is electrically connected to the fourth sampling control end G4, the first end of the fourth sampling control switch KG4 is electrically connected to the inverting input end of the operational amplifier O0, and the second end of the fourth sampling control switch KG4 is electrically connected to the first end of the fourth sampling resistor RS4;

The second end of the first sampling resistor RS1, the second end of the second sampling resistor RS2, the second end of the third sampling resistor RS3, and the second end of the fourth sampling resistor RS4 are respectively connected to the output end of the operational amplifier O0;

The filter circuit includes a filter resistor R1, a first filter capacitor Cf1 and a second filter capacitor Cf2;

The first end of the filter resistor R1 is electrically connected to the output end of the operational amplifier O0, and the second end of the filter resistor R1 is electrically connected to the input end of the analog-to-digital converter A0;

The first end of the first filter capacitor Cf1 is electrically connected to the output end of the operational amplifier O0, and the second end of the first filter capacitor Cf1 is grounded;

The first end of the second filter capacitor Cf2 is electrically connected to the input end of the analog-to-digital converter A0, and the second end of the second filter capacitor Cf2 is grounded;

The output end of the analog-to-digital converter A0 is electrically connected to the micro-control unit 80;

The micro-control unit 80 is electrically connected to the first sampling control end G1, the second sampling control end G2, the third sampling control end G3 and the fourth sampling control end G4, respectively, is configured to provide a first sampling control signal to the first sampling control end G1, provide a second sampling control signal to the second sampling control end G2, provide a third sampling control signal to the third sampling control end G3, and provide a fourth sampling control signal to the fourth sampling control end G4.

The micro-control unit 80 is also electrically connected to the level shifter 70, configured to provide the level shifter 70 with a first input light sensing control signal, a second input light sensing control signal, and a third input light sensing control signal a control signal and a fourth input light sensing control signal;

The level converter 70 is electrically connected to the first light sensing control end KR, the second light sensing control end KG, the third light sensing control end KB, and the fourth light sensing control end KW, respectively, and is configured to perform level conversion on the first input light sensing control signal to obtain a first light sensing control signal, and provide the first light sensing control signal to the first light sensing control end KR; perform level conversion on the second input light sensing control signal to obtain a second light sensing control signal, and provide the second light sensing control signal to the second light sensing control end KG; perform level conversion on the third input light sensing control signal to obtain a third light sensing control signal, and provide the third light sensing control signal to the third light sensing control end KB; perform level conversion on the fourth input light sensing control signal to obtain a fourth light sensing control signal, and provide the fourth light sensing control signal to the fourth light sensing control end KW;

The micro-control unit 80 is further configured to obtain the characteristics of the corresponding light signal according to the analog output voltage provided by the analog-to-digital converter A0 through the output end thereof;

The characteristics of the light signal may include at least one of light intensity, brightness, color coordinates, and color temperature.

In at least one embodiment of the light detection module shown in FIG. 10, each photodiode and each light sensing control transistor can be arranged on the display substrate, the operational amplifier O0, each sampling resistor, the filter circuit 40, each sampling control switch, the analog-to-digital converter A0, the micro-control unit 80 and the level converter 70 can be arranged on the circuit board or the display driver integrated circuit;

In at least one embodiment of the light detection module shown in FIG. 10, when each light sensing control transistor is fabricated by a thin film transistor (TFT) process, including a low temperature polysilicon (LTPS) P-type metal-oxide-semiconductor transistor (PMOS), an N-type metal-oxide-semiconductor transistor (LTPS NMOS) and an indium gallium zinc oxide (IGZO) and other processes, when each light sensing control transistor is an n-type transistor, when the potential of each light sensing control signal is 7V, each light sensing control transistor is turned on; when each light sensing control transistor is a p-type transistor, when the potential of each light sensing control signal is −7V, each light sensing control transistor is turned on; the low voltage value and high voltage value of each control signal provided by the micro-control unit 80 are 0V and 3V, respectively. At this time, the level converter 70 is used to convert 0V voltage into −7V voltage, and convert 3.3V voltage into 7V voltage, to meet the requirements of the control level of each light sensing control transistor.

In at least one embodiment of the light detection module shown in FIG. 10, the micro-control unit 80 may further include a first serial output interface Sc1 and a second serial output interface Sc2, and the characteristics of the light signal is outputted to the application unit through the first serial output interface Sc1 and the second serial output interface Sc2, so that the application unit can obtain data of the current ambient light according to the light signal.

In at least one embodiment of the light detection module shown in FIG. 10, the filter circuit 40 includes a filter resistor and two filter capacitors, and the filter circuit 40 is a π-type low-pass filter circuit, but the structure of the filter circuit 40 is not limited to the above structure, as long as the filter circuit 40 can achieve the purpose of filtering out high-frequency noise, the specific structure of the filter circuit 40 can be selected according to the actual situation;

The filter circuit 40 is a low-pass filter circuit, which can effectively filter out high-frequency noise, so that the output signal is stable and the noise fluctuation is reduced.

In at least one embodiment of the light detection module shown in FIG. 10, each light sensing control transistor may be an n-type transistor, but not limited thereto. In actual operation, the above transistors can also be replaced by p-type transistors.

In at least one embodiment of the light detection module shown in FIG. 10, the operational amplifier O0, the compensation capacitor C1 and the sampling resistors form a current-voltage converter. When KG1 is turned on, the resistance value of RS1 determines the transfer coefficient of the current-voltage converter. When KG2 is turned on, the resistance value of RS2 determines the transfer coefficient of the current-voltage converter. When KG3 is turned on, the resistance value of RS3 determines the transfer coefficient of the current-voltage converter, when KG4 is turned on, the resistance value of RS4 determines the transfer coefficient of the current-to-voltage converter.

In at least one embodiment of the light detection module shown in FIG. 10, the resistance value of the first sampling resistor RS1 is Rz1, the resistance value of the second sampling resistor RS2 is Rz2, the resistance value of the third sampling resistor RS1 is Rz3, the resistance value of the fourth sampling resistor RS4 is Rz4.

When at least one embodiment of the light detection module shown in FIG. 10 of the present disclosure is in operation, When KG1 is turned on, and the current value of the photocurrent connected to the inverting input end of the operational amplifier O0 is Iz, the voltage value of the analog output voltage outputted by the operational amplifier O0 is 2.0V−Iz×Rz1, the transfer coefficient of the current-voltage converter is Rz1;

When KG2 is turned on and the current value of the photocurrent connected to the inverting input end of the operational amplifier O0 is Iz, the voltage value of the analog output voltage outputted by the operational amplifier O0 is 2.0V−Iz×Rz2, the transfer coefficient of the current-voltage converter is Rz2;

When KG3 is turned on and the current value of the photocurrent connected to the inverting input end of the operational amplifier O0 is Iz, the voltage value of the analog output voltage outputted by the operational amplifier O0 is 2.0V−Iz×Rz3, the transfer coefficient of the current-voltage converter is Rz3;

When KG4 is turned on, and the current value of the photocurrent connected to the inverting input end of the operational amplifier O0 is Iz, the voltage value of the analog output voltage outputted by the operational amplifier O0 is 2.0V−Iz×Rz4, the transfer coefficient of the current-voltage converter is Rz4.

In at least one embodiment of the light detection module shown in FIG. 10, the resistance value Rz1 of RS1 may be 40 MΩ, the resistance value Rz2 of RS2 may be 4 MΩ, the resistance value Rz3 of RS3 may be 400 KΩ, and the resistance value Rz4 of RS4 may be is 40 KΩ, the capacitance value of the compensation capacitor C1 can be greater than or equal to 3 pF and less than or equal to 10 pF, and the capacitance value of the compensation capacitor C1 can be adjusted according to the characteristics of the sampling resistor and the operational amplifier.

In addition, considering the sampling accuracy, the leakage current of KG1, the leakage current of KG2, the leakage current of KG3 and the leakage current of KG4 are at least an order of magnitude smaller than the minimum sampling current, the leakage current of KG1, the smaller the leakage current of KG2, the leakage current of KG3, and the leakage current of KG4 are, the higher the sampling accuracy is.

The number of bits of the digital output voltage outputted by the analog-to-digital converter A0 is n (n is a positive integer, and in at least one embodiment of the light detection module shown in FIG. 10, n may be equal to 16, but not limited thereto), the analog-to-digital converter A0 can output $2n$ digital output voltages.

In at least one embodiment of the light detection module shown in FIG. 10, the high-precision voltage conversion range of the analog-to-digital converter A0 is the range of the analog output voltage that the analog-to-digital converter A0 can accurately perform analog-to-digital conversion; the high-precision voltage conversion range may be greater than or equal to the first voltage VS1 and less than or equal to the second voltage VS2, the first voltage VS1 may be equal to 0.2V, and the second voltage VS2 may be equal to 2.0V, but not limited thereto;

Since the photocurrent outputted by each photodiode is particularly small, the OS leakage current of the operational amplifier needs to be considered (the OS leakage current of the operational amplifier is the leakage current of the inverting and non-inverting input ends of the operational amplifier). Generally, the OS leakage current of the operational amplifier is required to be smaller an order of magnitude than the minimum collecting current accuracy, for example, the order of magnitude may be one tenth, and the smaller the OS leakage current is, the higher the collecting accuracy is.

In at least one embodiment of the light detection module shown in FIG. 10, the micro-control unit 80 may further include a first serial output interface Sc1 and a second serial output interface Sc2, and the characteristics of the light signal is outputted to the application unit through the first serial output interface Sc1 and the second serial output interface Sc2, so that the application unit can obtain the data of the current ambient light according to the light signal;

The first serial output interface Sc1 may be an SPI interface or an I2C interface, and the second serial output interface may be an SPI interface or an I2C interface, but not limited thereto.

Figure 11:
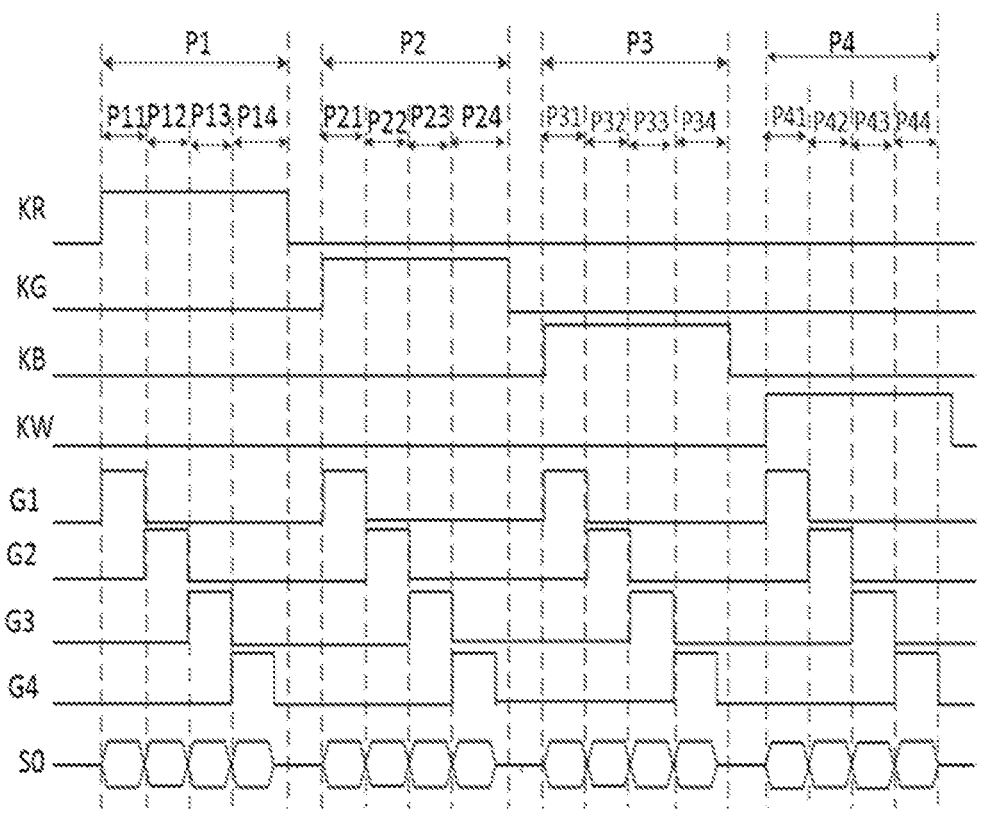
FIG. 11 is a timing sequence diagram of the light detection module shown in FIG. 10.

In FIG. 11, S0 is the digital output voltage outputted by the analog-to-digital converter A0.

As shown in FIG. 11, when at least one embodiment of the light detection module shown in FIG. 10 of the present disclosure is in operation, the sampling time period may include a first sampling phase P1, a second sampling phase P2, a third sampling phase and the fourth sampling phase P4 that are set in sequence;

The first sampling phase P1 may include a first sampling period P11, a second sampling period P12, a third sampling period P13 and a fourth sampling period P14 that are set in sequence;

The second sampling phase P2 may include a fifth sampling period P21, a sixth sampling period P22, a seventh sampling period P23 and an eighth sampling period P24 that are set in sequence;

The third sampling phase P3 may include a ninth sampling period P31, a tenth sampling period P32, an eleventh sampling period P33 and a twelfth sampling period P24 that are set in sequence;

The fourth sampling phase P4 may include a thirteenth sampling period P41, a fourteenth sampling period P42, a fifteenth sampling period P43 and a sixteenth sampling period P44 that are set in sequence;

In the first sampling period P11, KR provides a high voltage signal, G1 provides a high voltage signal, TR is turned on, KG1 is turned on, KG, KB and KW all provide a low voltage signal, G2, G3 and G4 all provide a low voltage signal, TG, TB, TW, KG2, KG3 and KG4 are all turned off, the first photodiode D1 is used to sense the red light signal to generate the corresponding first photocurrent, and the first photocurrent is transmitted to the non-inverting input end of the first operational amplifier O1 through TR and KG1 that are turned on, the first operational amplifier O1 outputs the first first analog output voltage, and filters out the high-frequency noise in the first first analog output voltage through R1, Cf1 and Cf2, outputs the first first analog output voltage after filtering out the noise to the input end of the analog-to-digital converter A0, the analog-to-digital converter A0 performs analog-to-digital conversion on the first first analog output voltage after filtering out the noise to obtain a first first digital output voltage, and outputs the first first digital output voltage to the micro-control unit 80;

In the second sampling period P12, KR provides a high voltage signal, G2 provides a high voltage signal, TR and KG2 are all turned on, KG, KB and KW all provide a low voltage signal, G1, G3 and G4 all provide a low voltage signal, TG, TB, TW, KG1, KG3 and KG4 are all turned off, and the first photodiode D1 is used to sense the red light signal to generate the corresponding first photocurrent, and the first photocurrent is transmitted to the non-inverting input end of the second operational amplifier O2 through TR and KG2 that are turned on, the second operational amplifier O2 outputs the second first analog output voltage, and filters out the high-frequency noise in the second first analog output voltage through R1, Cf1 and Cf2, outputs the second first analog output voltage after filtering out the noise to the input end of the analog-to-digital converter A0, the analog-to-digital converter A0 performs analog-to-digital conversion on the second first analog output voltage after filtering out the noise to obtain a second first digital output voltage, and outputs the second first digital output voltage to the micro-control unit 80;

In the third sampling period P13, KR provides a high voltage signal, G3 provides a high voltage signal, TR and KG3 are all turned on, KG, KB and KW all provide a low voltage signal, G1, G2 and G4 all provide a low voltage signal, TG, TB, TW, KG1, KG2 and KG4 are all turned off, the first photodiode D1 is used to sense the red light signal to generate the corresponding first photocurrent, and the first photocurrent is transmitted to the non-inverting input end of the third operational amplifier O3 through TR and KG3 that are turned on, the third operational amplifier O3 outputs the third first analog output voltage, and filters out high-frequency noise in the third first analog output voltage through R1, Cf1 and Cf2, and transmits the third first analog output voltage after filtering out the noise to the input end of the analog-to-digital converter A0, and the analog-to-digital converter A0 performs analog-to-digital conversion on the third first analog output voltage to obtain a third first digital output voltage, and outputs the third first digital output voltage to the micro-control unit 80;

In the fourth sampling period P14, KR provides a high voltage signal, G4 provides a high voltage signal, TR and KG4 are all turned on, KG, KB and KW all provide a low voltage signal, G1, G2 and G3 all provide a low voltage signal, TG, TB, TW, KG1, KG2 and KG3 are all turned off, the first photodiode D1 is used to sense the red light signal to generate the corresponding first photocurrent, and the first photocurrent is transmitted to the non-inverting input end of the fourth operational amplifier O4 through TR and KG4 that are turned on, the fourth operational amplifier O4 outputs the fourth first analog output voltage, and filters out high-frequency noise in the fourth first analog output voltage through R1, Cf1 and Cf2, and transmits the fourth first analog output voltage after filtering out the noise to the input end of the analog-to-digital converter A0, and the analog-to-digital converter A0 performs analog-to-digital conversion on the fourth first analog output voltage to obtain a fourth first digital output voltage, and outputting the fourth first digital output voltage to the micro-control unit 80;

In the fifth sampling period P21, KG provides a high voltage signal, G1 provides a high voltage signal, TG and KG1 are all turned on, KR, KB and KW all provide a low voltage signal, G2, G3 and G4 all provide a low voltage signal, TR, TB, TW, KG2, KG3 and KG4 are all turned off, the second photodiode D1 is used to sense the green light signal to generate the corresponding second photocurrent, and the second photocurrent is transmitted to the non-inverting input end of the first operational amplifier O1 through TG and KG1 that are turned on, the first operational amplifier O1 outputs the first second analog output voltage, and filters out high-frequency noise in the first second analog output voltage through R1, Cf1 and Cf2, and transmits the first second analog output voltage after filtering out the noise to the input end of the analog-to-digital converter A0, and the analog-to-digital converter A0 performs analog-to-digital conversion on the first second analog output voltage to obtain a first second digital output voltage, and output the first second digital output voltage to the micro-control unit 80;

In the sixth sampling period P22, KG provides a high voltage signal, G2 provides a high voltage signal, TG and KG2 are all turned on, KR, KB and KW all provide a low voltage signal, G1, G3 and G4 all provide a low voltage signal, TR, TB, TW, KG1, KG3 and KG4 are all turned off, the second photodiode D2 is used to sense the green light signal to generate the corresponding second photocurrent, the second photocurrent is transmitted to the non-inverting input end of the second operational amplifier O2 through TG and TG2 that are turned on, the second operational amplifier O2 outputs a second second analog output voltage, and filters out high-frequency noise in the second second analog output voltage through R1, Cf2 and Cf2, and transmits the second second analog output voltage after filtering the noise to the input end of the analog-to-digital converter A0, and the analog-to-digital converter A0 performs analog-to-digital conversion on the second analog output voltage after filtering out the noise to obtain a second second digital output voltage, and output the second second digital output voltage to the micro-control unit 80;

In the seventh sampling period P23, KG provides a high voltage signal, G3 provides a high voltage signal, TG and KG3 are all turned on, KR, KB and KW all provide a low voltage signal, G1, G2 and G4 all provide a low voltage signal, TR, TB, TW, KG1, KG2 and KG4 are all turned off, the second photodiode D2 is used to sense the green light signal to generate the corresponding second photocurrent, the second photocurrent is transmitted to the non-inverting input end of the third operational amplifier O3 through TG and TG3 that are turned on, the third operational amplifier O3 outputs the third second analog output voltage, and filters out high-frequency noise in the third second analog output voltage through R1, Cf1 and Cf2, and transmit the third second analog output voltage after filtering the noise to the input end of the analog-to-digital converter A0, and the analog-to-digital converter A0 performs analog-to-digital conversion on the second analog output voltage to obtain a third second digital output voltage, and output the third second digital output voltage to the micro-control unit 80;

In the eighth sampling period P24, KG provides a high voltage signal, G4 provides a high voltage signal, TG and KG4 are all turned on, KR, KB and KW all provide a low voltage signal, G1, G2 and G3 all provide a low voltage signal, TR, TB, TW, KG1, KG2 and KG3 are all turned off, the second photodiode D2 is used to sense the green light signal to generate the corresponding second photocurrent, and the second photocurrent is transmitted to the non-inverting input end of the fourth operational amplifier O4 through TG and KG4 that are turned on, the fourth operational amplifier O4 outputs the fourth second analog output voltage, and filters out high-frequency noise in the fourth second analog output voltage through R1, Cf1 and Cf2, and transmit the fourth second analog output voltage after filtering the noise to the input end of the analog-to-digital converter A0, and the analog-to-digital converter A0 performs analog-to-digital conversion on the second analog output voltage to obtain a fourth second digital output voltage, and output the fourth second digital output voltage to the micro-control unit 80;

In the ninth sampling period P31, KB provides a high voltage signal, G1 provides a high voltage signal, TB and KG1 are all turned on, KR, KG and KW all provide a low voltage signal, G2, G3 and G4 all provide a low voltage signal, TR, TG, TW, KG2, KG3 and KG4 are all turned off, the third photodiode D3 is used to sense the blue light signal to generate a corresponding third photocurrent, and the third photocurrent is transmitted to the non-inverting input end of the first operational amplifier O1 through TB and KG1 that are turned on, the first operational amplifier O1 outputs the first third analog output voltage, and filters out high-frequency noise in the first third analog output voltage through R1, Cf1 and Cf2, and transmits the first third analog output voltage after filtering the noise to the input end of the analog-to-digital converter A0, and the analog-to-digital converter A0 performs analog-to-digital conversion on the third analog output voltage to obtain a first third digital output voltage, and output the first third digital output voltage to the micro-control unit 80;

In the tenth sampling period P32, KB provides a high voltage signal, G2 provides a high voltage signal, TB and KG2 are all turned on, KR, KG and KW all provide a low voltage signal, G1, G3 and G4 all provide a low voltage signal, TR, TG, TW, KG1, KG3 and KG4 are all turned off, the third photodiode D3 is used to sense the blue light signal to generate a corresponding third photocurrent, and the third photocurrent is transmitted to the non-inverting input end of the second operational amplifier O2 through TB and KG2 that are turned on, the second operational amplifier O2 outputs the second third analog output voltage, and filters out high-frequency noise in the second third analog output voltage through R1, Cf2 and Cf2, and transmits the second third analog output voltage after filtering the noise to the input end of the analog-to-digital converter A0, and the analog-to-digital converter A0 performs analog-to-digital conversion on the second third analog output voltage to obtain a second third digital output voltage, and output the second third digital output voltage to the micro-control unit 80;

In the eleventh sampling period P33, KB provides a high-voltage signal, G3 provides a high voltage signal, TB and KG3 are all turned on, KR, KG and KW all provide a low voltage signal, G1, G2 and G4 all provide a low voltage signal, TR, TG, TW, KG1, KG2, and KG4 are all turned off, and the third photodiode D3 is used to sense the blue light signal to generate a corresponding third photocurrent, and the third photocurrent is transmitted to the non-inverting input end of the third operational amplifier O3 through TB and TG3 that are turned on, the third operational amplifier O3 outputs the third third analog output voltage, and filters out high-frequency noise in the third third analog output voltage through R1, Cf1 and Cf2, the analog-to-digital converter A0 performs analog-to-digital conversion on the third third analog output voltage to obtain a third third digital output voltage, and output the third third digital output voltage to the micro-control unit 80;

In the twelfth sampling period P34, KB provides a high-voltage signal, G4 provides a high-voltage signal, TB and KG4 are all turned on, KR, KG and KW all provide a low-voltage signal, G1, G2 and G3 all provide a low-voltage signal, TR, TG, TW, KG1, KG2, and KG3 are all turned off, and the third photodiode D3 is used to sense the blue light signal to generate a corresponding third photocurrent, and the third photocurrent is transmitted to the non-inverting input end of the fourth operational amplifier O4 through TB and TG4 that are turned on, the fourth operational amplifier O4 outputs the fourth third analog output voltage, and filters out the high-frequency noise in the fourth third analog output voltage through R1, Cf1 and Cf2, the analog-to-digital converter A0 performs analog-to-digital conversion on the fourth third analog output voltage to obtain a fourth third digital output voltage, and output the fourth third digital output voltage to the micro-control unit 80;

In the thirteenth sampling period P41, KW provides a high-voltage signal, G1 provides a high-voltage signal, TW and KG1 are all turned on, KR, KG and KB all provide a low-voltage signal, G2, G3 and G4 all provide a low-voltage signal, TR, TG, TB, KG2, KG3, and KG4 are all turned off, and the fourth photodiode D4 is used to sense the white light signal to generate a corresponding fourth photocurrent, and the fourth photocurrent is transmitted to the non-inverting input end of the first operational amplifier O1 through TW and KG1 that are turned on, the first operational amplifier O1 outputs the first and fourth analog output voltage, and filters out the high-frequency noise in the first fourth analog output voltage through R1, Cf1 and Cf2, the analog-to-digital converter A0 performs analog-to-digital conversion on the first fourth analog output voltage to obtain the first fourth digital output voltage, and output the first fourth digital output voltage to the micro-control unit 80;

In the fourteenth sampling period P42, KW provides a high-voltage signal, G2 all provide a high-voltage signal, TW and KG2 are all turned on, KR, KG and KB all provide a low-voltage signal, and G1, G3 and G4 all provide a low-voltage signal, TR, TG, TB, KG1, KG3 and KG4 are all turned off, and the fourth photodiode D4 is used to sense the white light signal to generate a corresponding fourth photocurrent, and the fourth photocurrent is transmitted to the non-inverting input end of the second operational amplifier O2 through TW and KG2 that are turned on, the second operational amplifier O2 outputs the second fourth analog output voltage, and filters out high-frequency noise in the second fourth analog output voltage through R1, Cf1 and Cf2, and transmits the second fourth analog output voltage after filtering out the noise to the input end of the analog-to-digital converter A0, and the analog-to-digital converter A0 performs analog-to-digital conversion on the second fourth analog output voltage to obtain a second fourth digital output voltage, and output the second fourth digital output voltage to the micro-control unit 80;

In the fifteenth sampling period P43, KG provides a high-voltage signal, G3 provides a high-voltage signal, TW and KG3 are all turned on, KR, KG and KB all provide a low-voltage signal, G1, G2 and G4 all provide a low-voltage signal, TR, TG, TB, KG1, KG2, and KG4 are all turned off, and the fourth photodiode D4 is used to sense the white light signal to generate a corresponding third photocurrent, and the third photocurrent is transmitted to the non-inverting input end of the third operational amplifier O3 through TW and KG3 that are turned on, the third operational amplifier O3 outputs the third and fourth analog output voltage, filters out the high-frequency noise in the third fourth analog output voltage through R1, Cf1 and Cf2, the analog-to-digital converter A0 performs analog-to-digital conversion on the third fourth analog output voltage to obtain a third fourth digital output voltage, and output the third fourth digital output voltage to the micro-control unit 80;

In the sixteenth sampling period P44, KG provides a high-voltage signal, G4 provides a high-voltage signal, TW and KG4 are all turned on, KR, KG and KB all provide a low-voltage signal, G1, G2 and G3 all provide a low-voltage signal, TR, TG, TB, KG1, KG2, and KG3 are all turned off, and the fourth photodiode D4 is used to sense a white light signal to generate a corresponding third photocurrent, and the third photocurrent is transmitted to the non-inverting input end of the fourth operational amplifier O4 through TW and KG4 that are turned on, the fourth operational amplifier O4 outputs the fourth fourth analog output voltage, filters out the high-frequency noise in the fourth fourth analog output voltage through R1, Cf1 and Cf2, the analog-to-digital converter A0 performs the analog-to-digital conversion on the fourth fourth analog output voltage to obtain a fourth fourth digital output voltage, and outputs the fourth fourth digital output voltage to the micro-control unit 80.

During operation of the light detection module shown in FIG. 10 of at least one embodiment of the present disclosure, a sampling time period includes a first sampling phase, a second sampling phase, a third sampling phase and a fourth sampling phase, the first photocurrent corresponding to the red light signal is sampled in the first sampling phase, the second photocurrent corresponding to the green light signal is sampled in the second sampling phase, the third photocurrent corresponding to the blue light signal is sampled in the third sampling phase, and the fourth photocurrent corresponding to the white light signal is sampled in the fourth sampling phase,;

Each sampling phase includes four sampling periods set in sequence, in the four sampling periods set in sequence, KG1, KG2, KG3, KG4 are controlled to be turned on in sequence; in the first sampling period included in each sampling phase, KG1 is turned on, KG2, KG3 and KG4 are turned off, and the first end of RS1 is connected to the inverting input end of the operational amplifier O0. At this time, the transfer coefficient of the current-voltage converters including O0, RS1 and C1 is Rz1; in the second sampling period included in each sampling phase, KG2 is turned on, KG1, KG3 and KG4 are turned off, and the first end of RS2 is connected to the inverting input end of the operational amplifier O0, the transfer coefficient of the current-voltage converter including O0, RS2 and C1 is Rz2; in the third sampling period included in each sampling phase, KG3 is turned on, KG1, KG2 and KG4 are turned off, and the first end of RS3 is connected to the inverting input end of the operational amplifier O0, the transfer coefficient of the current-voltage converter including O0, RS3 and C1 is Rz2; in the fourth sampling period included in each sampling phase, KG4 is turned on, KG1, KG2 and KG3 are turned off, and the first end of RS4 is connected to the inverting input end of the operational amplifier O0. At this time, the transfer coefficient of the current-voltage converters including O0, RS4 and C1 is Rz4;

Every time the analog converter A0 outputs a digital output voltage, the digital output voltage outputted by the analog-to-digital converter A0 is determined, and when the digital output voltage outputted by the analog-to-digital converter A0 is less than or equal to the first voltage VS1 (the high-precision voltage conversion range of the analog-to-digital converter A0 is greater than or equal to the first voltage VS1 and less than or equal to the second voltage VS2), then the corresponding digital output voltage is discarded, until the analog output voltage outputted by the operational amplifier O0 is within the high-precision voltage conversion range of the analog-to-digital converter A0, the current transfer coefficient is recorded, and the digital output voltage outputted by the analog-to-digital converter A0 is stored in the corresponding storage unit. After the entire sampling time period is completed, the micro-control unit 80 can obtain the characteristics of each light signal according to the transfer coefficient and the digital output voltage in the storage unit.

The light detection method described in the embodiment of the present disclosure is applied to the above-mentioned light detection module, and the light detection method includes:

Sensing, by N light sensing circuits, light signals of different colors respectively to generate corresponding photocurrents;

Controlling, by the control circuit, to provide the photocurrents generated by the light sensing circuits to a conversion circuit in a time division manner, and controlling a transfer coefficient of the conversion circuit;

Converting, by the conversion circuit, the photocurrents according to the transfer coefficient to obtain an analog output voltage;

Obtaining, by a detection circuit, characteristics of the light signal according to the analog output voltage.

The light detection method described in the embodiments of the present disclosure senses light signals of different colors through different light sensing circuits, generates corresponding photocurrents, and the control circuit controls to provide the photocurrents to the conversion circuit in a time division manner. The control circuit controls the transfer coefficient of the conversion circuit, the conversion circuit converts the photocurrent according to the transfer coefficient to obtain an analog output voltage, and the detection circuit obtains the characteristics of the light signal according to the analog output voltage, which can accurately sense features of ambient light of different colors.

Optionally, the control circuit includes a light sensing control sub-circuit and a sampling control sub-circuit; the conversion circuit includes a sampling sub-circuit and M conversion sub-circuits; the sampling sub-circuit includes M sampling resistors; the input end of the mth conversion sub-circuit is electrically connected to the mth sampling resistor; M is a positive integer; m is a positive integer less than or equal to M;

The step of controlling, by the control circuit, to provide the photocurrents generated by the light sensing circuits to a conversion circuit in a time division manner includes: controlling, by the light sensing control sub-circuit, to provide the photocurrents generated by the light sensing circuits to the sampling control sub-circuit in a time division manner through the current supply end under the control of the light sensing control signal; controlling, by the sampling control sub-circuit, the current supply end to provide the photocurrents to the input ends of the conversion sub-circuits in a time division manner under the control of the sampling control signal;

The step of converting, by the conversion circuit, the photocurrent according to the transfer coefficient to obtain an analog output voltage includes: when the input end of the conversion sub-circuit receives the photocurrent, performing, by the conversion sub-circuit, the conversion to the photocurrent to obtain the analog output voltage.

Optionally, the control circuit includes a light sensing control sub-circuit and a sampling control sub-circuit; the conversion circuit includes a conversion sub-circuit and a sampling sub-circuit; the sampling sub-circuit includes M sampling resistors; M is a positive integer;

The step of controlling, by the control circuit, to provide the photocurrents generated by the light sensing circuits to a conversion circuit in a time division manner includes: controlling, by the light sensing control sub-circuit, to provide the photocurrents generated by the light sensing circuits to the input end of the conversion sub-circuit in a time division manner under the control of the light sensing control signal; controlling, by the sampling control sub-circuit, to connect the first ends of the sampling resistors and the input end of the conversion sub-circuit in a time division manner under the control of the sampling control signal;

The step of converting, by the conversion circuit, the photocurrent according to the transfer coefficient to obtain an analog output voltage includes: performing, by the conversion sub-circuit, conversion on the photocurrent to obtain the analog output voltage and output the analog output voltage through the output end of the conversion sub-circuit.

In at least one embodiment of the present disclosure, the detection circuit includes an analog-to-digital converter and an output processing unit;

The steps of obtaining, by the detection circuit, the characteristic of the light signal according to the analog output voltage include:

Converting, by the analog-to-digital converter, the analog output voltage into a digital output voltage;

Obtaining, by the output processing unit, the characteristics of the light signal according to the digital output voltage.

Optionally, the high-precision voltage conversion range of the analog-to-digital converter is greater than or equal to the first voltage VS1 and less than or equal to the second voltage VS2, and the voltage conversion range of the analog-to-digital converter is greater than or equal to the third voltage VS3 and less than or equal to the fourth voltage VS3; the fourth voltage VS3 is greater than the second voltage VS2; the third voltage VS3 is less than the first voltage VS1;

The steps of obtaining, by the output processing unit, the characteristic of the light signal according to the digital output voltage include:

Determining whether a voltage value of the analog output voltage corresponding to the digital output voltage is greater than or equal to the second voltage VS2 or less than or equal to the first voltage VS1;

When it is determined that the voltage value of the analog output voltage corresponding to the digital output voltage is greater than or equal to the second voltage VS2 or less than or equal to the first voltage VS1, discarding the digital output voltage;

When it is determined that the voltage value of the analog output voltage corresponding to the digital output voltage is greater than the first voltage VS1 and less than the second voltage VS2, obtaining the characteristics of the light signal according to the digital output voltage.

In a specific implementation, when the voltage value of the analog output voltage corresponding to the digital output voltage is greater than or equal to the second voltage VS2 or less than or equal to the first voltage VS1, the voltage value of the analog output voltage connected to the input end of the analog-to-digital converter exceeds the high-precision voltage conversion range of the analog-to-digital converter, so it is necessary to discard the digital output voltage and other sampling resistors is used for re-sampling.

The display device according to the embodiment of the present disclosure includes the above-mentioned light detection module.

The display device according to the embodiment of the present disclosure includes the above-mentioned pixel circuit.

The display device provided by the embodiment of the present disclosure may be any product or component with a display function, such as a mobile phone, a tablet computer, a television, a monitor, a notebook computer, a digital photo frame, and a navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A light detection module, comprising N light sensing circuits, a control circuit, a conversion circuit and a detection circuit; N being a positive integer; wherein
the N light sensing circuits respectively sense light signals of different colors to generate corresponding photocurrents;
the control circuit is configured to control to provide the photocurrents generated by the light sensing circuits to the conversion circuit in a time division manner, and to control a transfer coefficient of the conversion circuit;
the conversion circuit is configured to convert the photocurrent according to the transfer coefficient to obtain an analog output voltage;
the detection circuit is configured to obtain characteristics of the light signal according to the analog output voltage;
wherein the control circuit comprises a light sensing control sub-circuit and a sampling control sub-circuit; the conversion circuit comprises a sampling sub-circuit and M conversion sub-circuits; the sampling sub-circuit includes M sampling resistors; M is a positive integer;
an input end of an mth conversion sub-circuit is electrically connected to an mth sampling resistor; m is a positive integer less than or equal to M;
the light sensing control sub-circuit is configured to control to provide the photocurrents generated by the light sensing circuits to the sampling control sub-circuit in a time division manner through a current supply end under the control of a light sensing control signal;
the sampling control sub-circuit is configured to control the current supply end to provide the photocurrents to the input ends of the conversion sub-circuits in a time division manner under the control of a sampling control signal;
the conversion sub-circuit is configured to convert a photocurrent when the input end of the conversion sub-circuit receives the photocurrent, to obtain the analog output voltage.

2. The light detection module according to claim 1, wherein the control circuit further comprises a switch sub-circuit;
the switch sub-circuit is configured to control the conversion sub-circuits to output the analog output voltage to the detection circuit in a time division manner under the control of a switch control signal.

3. The light detection module according to claim 1, wherein the light sensing control sub-circuit includes N light sensing control transistors, the sampling control sub-circuit includes M sampling control transistors; an nth light sensing circuit outputs an nth photocurrent through an nth photocurrent output end;

a control electrode of an nth light sensing control transistor is electrically connected to the nth light sensing control end, a first electrode of the nth light sensing control transistor is electrically connected to the nth photocurrent output end, and a second electrode of the nth light sensing control transistor is electrically connected to the current supply end; the nth light sensing control end is configured to provide an nth light sensing control signal;

a control electrode of an mth sampling control transistor is electrically connected to an mth sampling control end, a first electrode of the mth sampling control transistor is electrically connected to the current supply end, and a second electrode of the mth sampling control transistor is electrically connected to the input end of the mth conversion sub-circuit; the mth sampling control end is configured to provide an mth sampling control signal;

an output end of the mth conversion sub-circuit is electrically connected to the detection circuit, and the mth conversion sub-circuit is configured to convert the nth photocurrent when the input end of the mth conversion sub-circuit receives the nth photocurrent, to obtain a corresponding analog output voltage, and output the corresponding analog output voltage to the detection circuit through the output end of the nth conversion sub-circuit.

4. The light detection module according to claim 3, wherein the control circuit further comprises a switch sub-circuit; the switch sub-circuit comprises M switches;

a control end of an mth switch is electrically connected to an mth switch control end, a first end of the mth switch is electrically connected to the output end of the mth conversion sub-circuit, and a second end of the mth switch is electrically connected to the detection circuit; the mth switch control end is configured to provide an mth switch control signal.

5. The light detection module according to claim 4, further comprising M filter circuits; wherein an mth filter circuit is connected between the output end of the mth conversion sub-circuit and the first end of the mth switch, and is configured to filter out high frequency noise in the corresponding analog output voltage.

6. The light detection module according to claim 1, wherein the mth conversion sub-circuit includes an mth operational amplifier; a non-inverting input end of the mth operational amplifier is the input end of the mth conversion sub-circuit; an inverting input end of the mth operational amplifier is electrically connected to the output end of the mth operational amplifier; the output end of the mth operational amplifier is the output end of the mth conversion sub-circuit;

the light detection module further includes a clamping circuit;

the clamping circuit is electrically connected to the input end of the detection circuit, and the detection circuit receives the analog output voltage through the input end of the detection circuit; the clamping circuit is configured to control a potential of the input end of the detection circuit to be less than or equal to a predetermined voltage value;

or wherein the mth conversion sub-circuit includes an mth operational amplifier and an mth compensation capacitor; an inverting input end of the mth operational amplifier is the input end of the mth conversion sub-circuit; a non-inverting input end of the mth operational amplifier is electrically connected to a reference voltage end, and the mth compensation capacitor is connected between the inverting input end of the mth operational amplifier and the output end of the mth operational amplifier; the reference voltage end is used to provide a reference voltage; the output end of the mth operational amplifier is the output end of the mth conversion sub-circuit.

7. The light detection module according to claim 1, further comprising a control signal generating unit; wherein the control signal generating unit is configured to provide the light sensing control signal and the sampling control signal.

8. The light detection module according to claim 7, wherein the detection circuit comprises an analog-to-digital converter and an output processing unit;

the analog-to-digital converter is configured to convert the analog output voltage to the digital output voltage;

the output processing unit is electrically connected to the analog-to-digital converter, and is configured to receive the digital output voltage and obtain the characteristics of the light signal according to the digital output voltage, wherein the characteristics of the light signal include at least one of light intensity, brightness, color coordinates, or color temperature.

9. The light detection module according to claim 1, wherein the nth light sensing circuit comprises an nth photodiode; n is a positive integer less than or equal to N;

a cathode of the nth photodiode is electrically connected to a power supply voltage end, and an anode of the nth photodiode is configured to provide an nth photocurrent;

the power supply voltage end is configured to provide a power supply voltage signal.

10. A light detection method, applied to the light detection module according to claim 1, comprising:

sensing, by N light sensing circuits, light signals of different colors respectively to generate corresponding photocurrents;

controlling, by the control circuit, to provide the photocurrents generated by the light sensing circuits to the conversion circuit in a time division manner, and controlling the transfer coefficient of the conversion circuit;

converting, by the conversion circuit, the photocurrents according to the transfer coefficient to obtain the analog output voltage;

obtaining, by the detection circuit, the characteristics of the light signal according to the analog output voltage.

11. The light detection method according to claim 10, wherein the control circuit includes a light sensing control sub-circuit and a sampling control sub-circuit; the conversion circuit includes a sampling sub-circuit and M conversion sub-circuits; the sampling sub-circuit includes M sampling resistors; an input end of an mth conversion sub-circuit is electrically connected to an mth sampling resistor; M is a positive integer; m is a positive integer less than or equal to M;

the step of controlling, by the control circuit, to provide the photocurrents generated by the light sensing circuits to the conversion circuit in a time division manner includes: controlling, by the light sensing control sub-circuit, to provide the photocurrents generated by the light sensing circuits to the sampling control sub-circuit in a time division manner through the current supply end under the control of the light sensing control signal; controlling, by the sampling control sub-circuit, the current supply end to provide the photocurrents to the input ends of the conversion sub-circuits in a time division manner under the control of the sampling control signal;

the step of converting, by the conversion circuit, the photocurrent according to the transfer coefficient to obtain an analog output voltage includes: when the input end of the conversion sub-circuit receives the photocurrent, performing, by the conversion sub-circuit, the conversion to the photocurrent to obtain the analog output voltage.

12. The light detection method according to claim 10, wherein the control circuit includes a light sensing control sub-circuit and a sampling control sub-circuit; the conversion circuit includes a conversion sub-circuit and a sampling sub-circuit; the sampling sub-circuit includes M sampling resistors; M is a positive integer;

the step of controlling, by the control circuit, to provide the photocurrents generated by the light sensing circuits to a conversion circuit in a time division manner includes: controlling, by the light sensing control sub-circuit, to provide the photocurrents generated by the light sensing circuits to the input end of the conversion sub-circuit in a time division manner under the control of the light sensing control signal; controlling, by the sampling control sub-circuit, to connect first ends of the sampling resistors and the input end of the conversion sub-circuit in a time division manner under the control of the sampling control signal;

the step of converting, by the conversion circuit, the photocurrent according to the transfer coefficient to obtain an analog output voltage includes: performing, by the conversion sub-circuit, conversion on the photocurrent to obtain the analog output voltage and output the analog output voltage through the output end of the conversion sub-circuit.

13. The light detection method according to claim 10, wherein the detection circuit includes an analog-to-digital converter and an output processing unit;

the steps of obtaining, by the detection circuit, the characteristic of the light signal according to the analog output voltage include:

converting, by the analog-to-digital converter, the analog output voltage into a digital output voltage;

obtaining, by the output processing unit, the characteristics of the light signal according to the digital output voltage.

14. The light detection method according to claim 13, wherein a high-precision voltage conversion range of the analog-to-digital converter is greater than or equal to a first voltage VS1 and less than or equal to a second voltage VS2, and a voltage conversion range of the analog-to-digital converter is greater than or equal to a third voltage VS3 and less than or equal to a fourth voltage VS3; the fourth voltage VS3 is greater than the second voltage VS2; the third voltage VS3 is less than the first voltage VS1;

the steps of obtaining, by the output processing unit, the characteristic of the light signal according to the digital output voltage include:

determining whether a voltage value of the analog output voltage corresponding to the digital output voltage is greater than or equal to the second voltage VS2 or less than or equal to the first voltage VS1;

when it is determined that the voltage value of the analog output voltage corresponding to the digital output voltage is greater than or equal to the second voltage VS2 or less than or equal to the first voltage VS1, discarding the digital output voltage;

when it is determined that the voltage value of the analog output voltage corresponding to the digital output voltage is greater than the first voltage VS1 and less than the second voltage VS2, obtaining the characteristics of the light signal according to the digital output voltage.

15. A display device comprising the light detection module according to claim 1.

16. A light detection module, comprising N light sensing circuits, a control circuit, a conversion circuit and a detection circuit; N being a positive integer; wherein the N light sensing circuits respectively sense light signals of different colors to generate corresponding photocurrents;

the control circuit is configured to control to provide the photocurrents generated by the light sensing circuits to the conversion circuit in a time division manner, and to control a transfer coefficient of the conversion circuit;

the conversion circuit is configured to convert the photocurrent according to the transfer coefficient to obtain an analog output voltage;

the detection circuit is configured to obtain characteristics of the light signal according to the analog output voltage;

wherein the control circuit comprises a light sensing control sub-circuit and a sampling control sub-circuit; the conversion circuit comprises a conversion sub-circuit and a sampling sub-circuit; the sampling sub-circuit includes M sampling resistors; M is a positive integer;

the light sensing control sub-circuit is configured to control to provide the photocurrents generated by the light sensing circuits to the input end of the conversion sub-circuit in time division manner under the control of the light sensing control signal;

the sampling control sub-circuit is configured to control first ends of the sampling resistors to be connected to the input end of the conversion sub-circuit in a time division manner under the control of the sampling control signal; control second ends of the sampling resistors to be connected to the output end of the conversion sub-circuit;

the conversion sub-circuit is used to convert the photocurrent to obtain and output the analog output voltage through the output end of the conversion sub-circuit.

17. The light detection module according to claim 16, wherein the light sensing control sub-circuit includes N light sensing control transistors; the sampling control sub-circuit includes M sampling control switches; n is a positive integer less than or equal to N, and m is a positive integer less than or equal to M;

a control electrode of an nth light sensing control transistor is electrically connected to the nth light sensing control end, a first electrode of the nth light sensing control transistor is electrically connected to the nth photocurrent output end, and a second electrode of the nth light sensing control transistor is electrically connected to the input end of the conversion sub-circuit; the nth light sensing control end is used to provide an nth light sensing control signal;

a control end of an mth sampling control switch is electrically connected to the mth sampling control end, a first end of the mth sampling control switch is electrically connected to the input end of the conversion sub-circuit, and a second end of the mth sampling control switch is electrically connected to the first end of the mth sampling resistor, and the second end of the mth sampling resistor is electrically connected to the output end of the conversion sub-circuit.

18. The light detection module according to claim 17, further comprising a filter circuit; wherein
the filter circuit is connected between the output end of the conversion sub-circuit and the detection circuit, and is configured to filter out high frequency noise in the analog output voltage, and provide the analog output voltage after filtering out the high frequency noise to the detection circuit;
the detection circuit is configured to obtain the characteristics of the light signal according to the analog output voltage after filtering out the high frequency noise.

19. The light detection module according to claim 16, wherein the conversion sub-circuit includes an operational amplifier and a compensation capacitor; the inverting input end of the operational amplifier is the input end of the conversion sub-circuit, and the non-inverting input end of the operational amplifier is electrically connected to the reference voltage end; the compensation capacitor is connected between the inverting input end of the operational amplifier and the output end of the operational amplifier; the reference voltage end is used to provide a reference voltage; the output end of the operational amplifier is the output end of the conversion sub-circuit;
or
wherein the conversion sub-circuit includes an operational amplifier; a non-inverting input end of the operational amplifier is the input end of the conversion sub-circuit, and an inverting input end of the operational amplifier is electrically connected to an output end of the operational amplifier, the output end of the operational amplifier is the output end of the conversion sub-circuit;
the light detection module further includes a clamping circuit;
the clamping circuit is electrically connected to the input end of the detection circuit, and the detection circuit receives the analog output voltage through the input end of the detection circuit; the clamping circuit is used to control a potential of the input end of the detection circuit to be less than or equal to a predetermined voltage value,
wherein the detection circuit comprises an analog-to-digital converter and an output processing unit; the analog-to-digital converter is configured to convert the analog output voltage into a digital output voltage; the output processing unit is electrically connected to the analog-to-digital converter, and is configured to receive the digital output voltage, and obtain the characteristics of the light signal according to the digital output voltage;
a high-precision voltage conversion range of the analog-to-digital converter is greater than or equal to a first voltage VS1 and less than or equal to a second voltage VS2; a voltage conversion range of the analog-to-digital converter is greater than or equal to a third voltage VS3 and less than or equal to a fourth voltage VS4; the fourth voltage VS4 is greater than the second voltage VS2;
the predetermined voltage value is greater than or equal to the second voltage VS2 and less than or equal to the fourth voltage VS4.

* * * * *